(12) United States Patent
Kim et al.

(10) Patent No.: US 11,469,171 B2
(45) Date of Patent: Oct. 11, 2022

(54) SEMICONDUCTOR DEVICES INCLUDING CONTACT PLUGS

(71) Applicant: SAMSUNG ELECTRONICS CO., LTD., Suwon-si (KR)

(72) Inventors: Kihyun Kim, Hwaseong-si (KR); Youngho Kwon, Suwon-si (KR); Sangrok Lee, Seoul (KR)

(73) Assignee: Samsung Electronics Co., Ltd., Suwon-si (KR)

(*) Notice: Subject to any disclaimer, the term of this patent is extended or adjusted under 35 U.S.C. 154(b) by 56 days.

(21) Appl. No.: 17/021,065

(22) Filed: Sep. 15, 2020

(65) Prior Publication Data

US 2021/0327804 A1    Oct. 21, 2021

(30) Foreign Application Priority Data

Apr. 21, 2020   (KR) .................. 10-2020-0047878

(51) Int. Cl.
| | | |
|---|---|---|
| *H01L 23/522* | (2006.01) | |
| *H01L 23/528* | (2006.01) | |
| *H01L 27/1157* | (2017.01) | |
| *H01L 27/11524* | (2017.01) | |
| *H01L 27/11582* | (2017.01) | |
| *H01L 27/11556* | (2017.01) | |

(52) U.S. Cl.
CPC ........ *H01L 23/5226* (2013.01); *H01L 23/528* (2013.01); *H01L 27/1157* (2013.01); *H01L 27/11524* (2013.01); *H01L 27/11556* (2013.01); *H01L 27/11582* (2013.01)

(58) Field of Classification Search
CPC ......... H01L 21/76838; H01L 21/76877; H01L 21/76897; H01L 27/11575; H01L 23/5226; H01L 23/528; H01L 23/5283; H01L 25/0657; H01L 27/11524; H01L 27/11556; H01L 27/1157; H01L 27/11582; H01L 27/11573
See application file for complete search history.

(56) References Cited

U.S. PATENT DOCUMENTS

| | | | |
|---|---|---|---|
| 9,012,974 B2 | 4/2015 | Chae et al. | |
| 9,691,782 B1* | 6/2017 | Hwang | ............. H01L 27/11573 |
| 9,991,282 B1 | 6/2018 | Shimizu et al. | |
| 10,283,566 B2 | 5/2019 | Sel et al. | |

(Continued)

*Primary Examiner* — Galina G Yushina
(74) *Attorney, Agent, or Firm* — Volentine, Whitt & Francos, PLLC

(57) ABSTRACT

A semiconductor device includes a lower circuit structure including a lower conductive pattern on a substrate, a middle wiring structure including horizontal wiring on the lower circuit structure, and a middle circuit structure on the middle wiring structure and including a stacked structure of alternating wiring and insulation layers. A channel structure extends through the stacked structure and contacts the horizontal wiring. A contact plug contacting the first lower conductive pattern and the horizontal wiring is in the middle wiring structure. A lowermost end of the channel structure is farther from a top of the substrate than a bottom of the horizontal wiring. An uppermost end of the contact plug is farther from the top of the substrate than the bottom of the horizontal wiring. The uppermost end of the contact plug is closer to the top of the substrate than a lowermost end of the wiring layers.

20 Claims, 26 Drawing Sheets

(56) References Cited

U.S. PATENT DOCUMENTS

| | | |
|---|---|---|
| 10,332,902 B2 | 6/2019 | Son et al. |
| 10,522,460 B2 | 12/2019 | Ichinose et al. |
| 10,734,400 B1* | 8/2020 | Fukuo ............... H01L 21/76834 |
| 2012/0098139 A1 | 4/2012 | Chae et al. |
| 2018/0076212 A1 | 3/2018 | Son et al. |
| 2018/0151589 A1 | 5/2018 | Shimizu et al. |
| 2018/0277477 A1* | 9/2018 | Ishihara ............... H01L 23/528 |
| 2018/0350879 A1 | 12/2018 | Sel et al. |
| 2019/0081062 A1 | 3/2019 | Wada et al. |
| 2019/0088586 A1 | 3/2019 | Ichinose et al. |
| 2019/0198524 A1 | 6/2019 | Fujiki et al. |
| 2019/0221581 A1 | 7/2019 | Lee et al. |
| 2019/0378852 A1 | 12/2019 | Baek et al. |

* cited by examiner

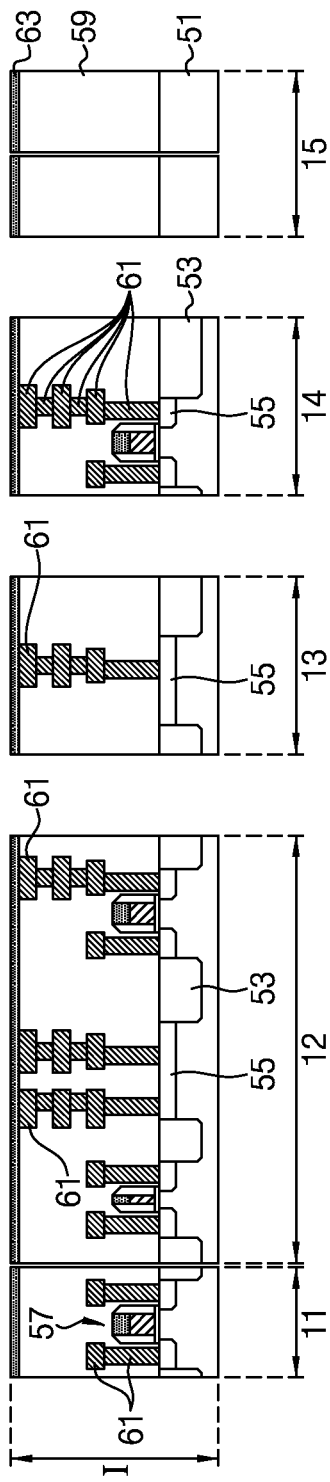
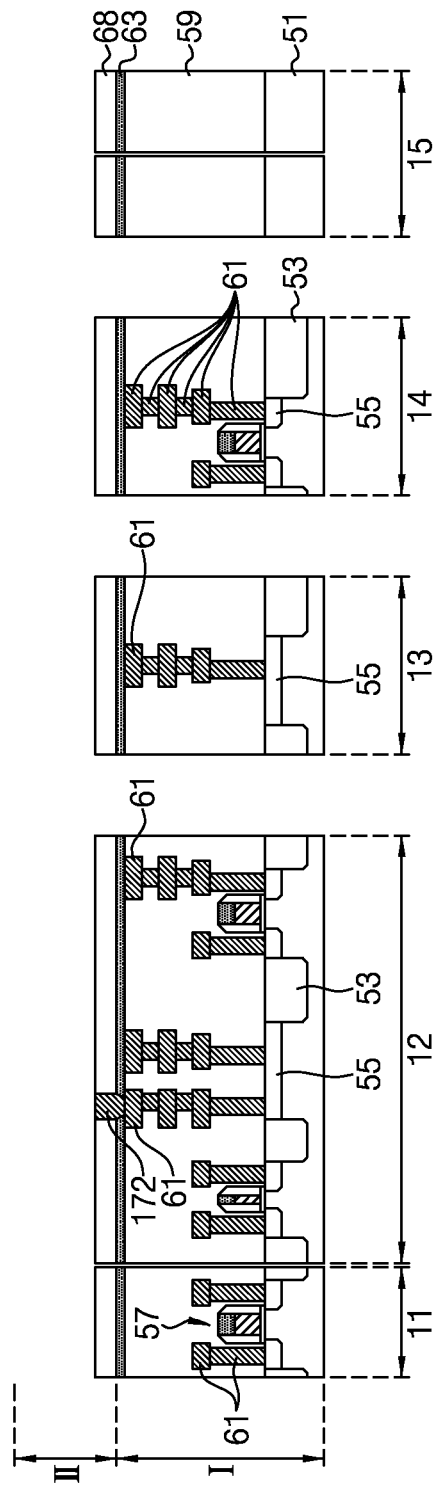

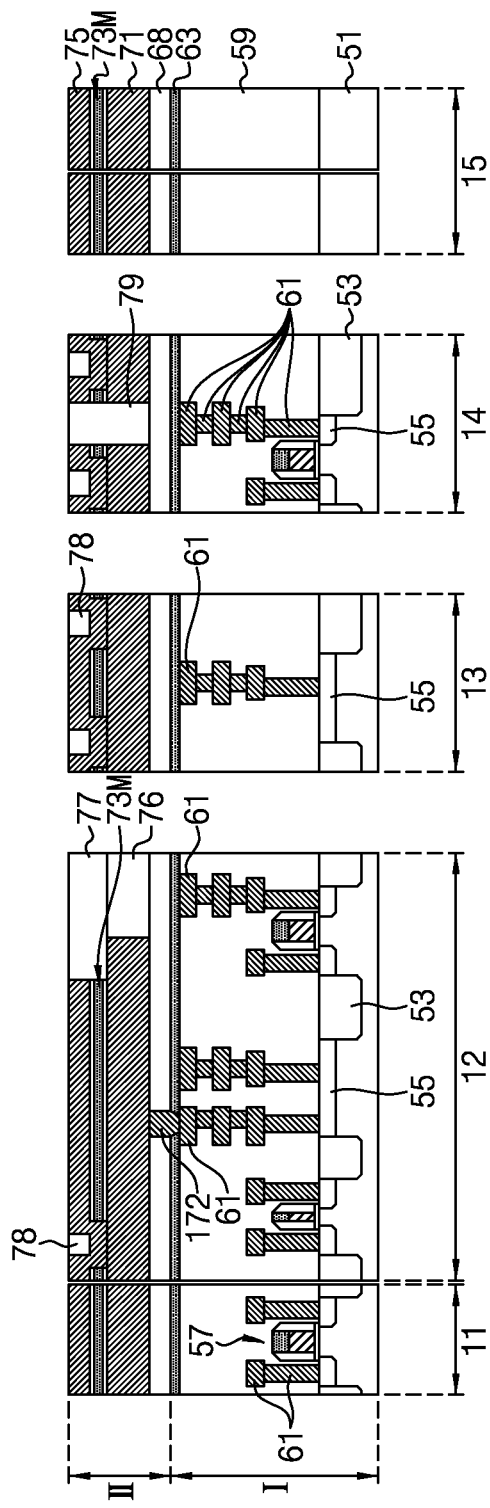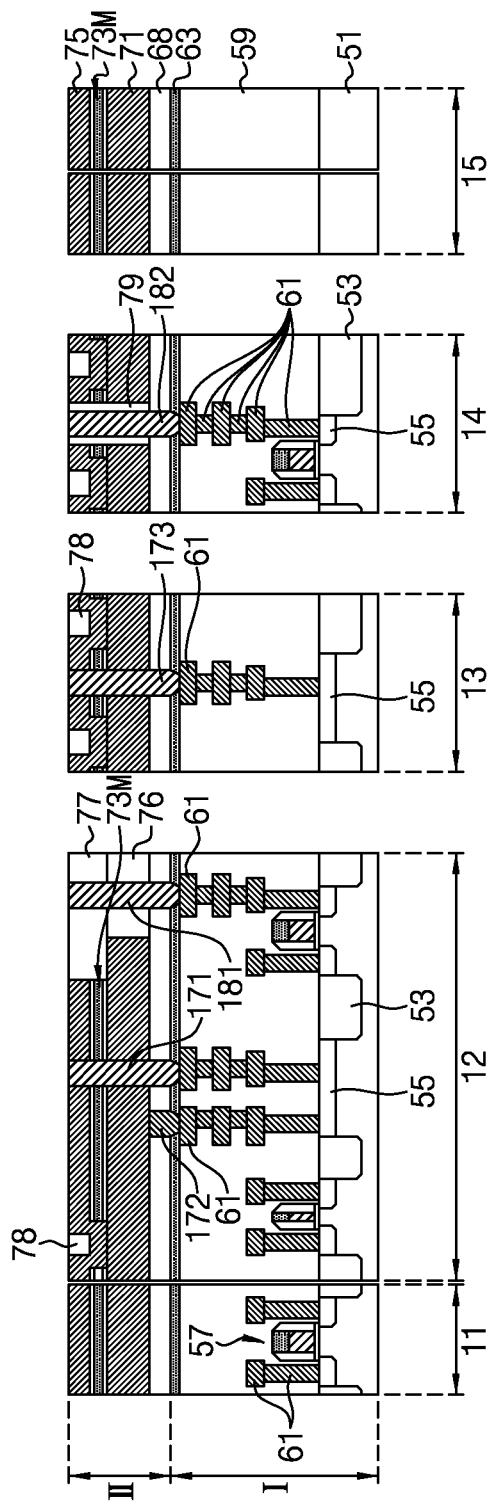

SEMICONDUCTOR DEVICES INCLUDING CONTACT PLUGS

CROSS-REFERENCE TO THE RELATED APPLICATION

This U.S. non-provisional patent application claims priority from Korean Patent Application No. 10-2020-0047878 filed on Apr. 21, 2020 in the Korean Intellectual Property Office (KIPO), the subject matter of which is hereby incorporated by reference.

BACKGROUND

1. Field

The inventive concept relates generally to semiconductor devices and methods of manufacturing semiconductor devices. More particularly, the inventive concept relates to semiconductor devices including contact plugs and methods of manufacturing same.

2. Description of the Related Art

Consistent demands for increased integration density have motivated the development of three-dimensional, or vertically integrated semiconductor devices. Such semiconductor devices usually include a lower circuit structure formed on a stacked substrate that is vertically disposed on the lower circuit structure. In this regard, stacked structures have become increasing complex and progressively taller (i.e., vertically thick). As a result, the aspect ratio(s) of though via(s) passing, wholly or in part, through the stacked structure to connect with the lower circuit structure are increasing. Unfortunately, the formation of high aspect ratio through vias requires an ever more complex set of manufacturing processes.

SUMMARY

Embodiments of the inventive concept provide semiconductor devices including through vias providing excellent electrical performance, yet methods of manufacturing these semiconductor devices are relatively simplified.

In one embodiment of the inventive concept, a semiconductor device includes; a lower circuit structure disposed on a substrate, the lower circuit structure including a first lower conductive pattern, a middle wiring structure disposed on the lower circuit structure, the middle wiring structure including a horizontal wiring, a middle circuit structure disposed on the middle wiring structure, the middle circuit structure including a stacked structure including alternately stacked wiring layers and insulation layers, a channel structure extending to an inner portion of the stacked structure to contact the horizontal wiring, and a contact plug extending to an inner portion of the middle wiring structure to contact the first lower conductive pattern and the horizontal wiring. A lowermost end of the channel structure is farther away from a top surface of the substrate than a bottom surface of the horizontal wiring, an uppermost end of the contact plug is farther away from the top surface of the substrate than the bottom surface of the horizontal wiring, and the uppermost end of the contact plug is disposed closer to the top surface of the substrate than a lowermost end of each of the wiring layers.

In another embodiment of the inventive concept, a semiconductor device includes; a lower circuit structure disposed on a substrate, the lower circuit structure including a lower conductive pattern, a middle wiring structure disposed on the lower circuit structure, the middle wiring structure including a horizontal wiring, a middle circuit structure disposed on the middle wiring structure, the middle circuit structure including a stacked structure including alternately stacked wiring layers and insulation layers, channel structures respectively extending to an inner portion of the stacked structure to contact the horizontal wiring, a relay plug extending to an inner portion of the middle wiring structure to contact the lower conductive pattern, a through via disposed on the relay plug to extend to an inner portion of the middle circuit structure and cell contact plugs respectively extending to an inner portion of the middle wiring structure to contact the wiring layers. A lowermost end of each one of the channel structures is farther away from a top surface of the substrate than a bottom surface of the horizontal wiring, an uppermost end of the relay plug is farther away from the top surface of the substrate than the bottom surface of the horizontal wiring and the uppermost end of the relay plug is disposed closer to the top surface of the substrate than a lowermost end of each one of the wiring layers.

In still another embodiment of the inventive concept, a semiconductor device includes; a lower circuit structure disposed on a substrate, the lower circuit structure including a first lower conductive pattern and a second lower conductive pattern, a middle wiring structure disposed on the lower circuit structure, the middle wiring structure including a horizontal wiring, a middle circuit structure disposed on the middle wiring structure, the middle circuit structure including a stacked structure including alternately stacked wiring layers and insulation layers, channel structures respectively extending to an inner portion of the stacked structure to contact the horizontal wiring, a contact plug extending to an inner portion of the middle wiring structure to contact the first lower conductive pattern and the horizontal wiring, a relay plug extending to an inner portion of the middle wiring structure to contact the second lower conductive pattern, a through via disposed on the relay plug and extending to an inner portion of the middle circuit structure, cell contact plugs respectively extending to an inner portion of the middle wiring structure to contact the wiring layers and an upper wiring structure disposed on the middle circuit structure, the upper wiring structure including bit lines connected to the channel structures, and an upper wiring connected to the through via. Uppermost ends of the contact plug and the relay plug are substantially coplanar, the uppermost ends of the contact plug and the relay plug are farther away from a top surface of the substrate than a bottom surface of the horizontal wiring, and the uppermost ends of the contact plug and the relay plug are disposed closer to the top surface of the substrate than a lowermost end of each of the wiring layers.

BRIEF DESCRIPTION OF THE DRAWINGS

FIGS. 26, 27, 28, 29 and 30 are related, cross-sectional diagrams illustrating methods of manufacturing semiconductor devices according to embodiments of the inventive concept.

DETAILED DESCRIPTION

Throughout the written description and drawings like reference numbers and labels are used to denote like or similar elements and/or features. Throughout the written description certain geometric terms may be used to highlight relative relationships between elements, components and/or features with respect to certain embodiments of the inventive concept. Those skilled in the art will recognize that such geometric terms are relative in nature, arbitrary in descriptive relationship(s) and/or directed to aspect(s) of the illustrated embodiments. Geometric terms may include, for example: height/width; vertical/horizontal; top/bottom; higher/lower; closer/farther; thicker/thinner; proximate/distant; above/below; under/over; upper/middle/lower; center/side; surrounding; overlay/underlay; etc.

Figure 1:
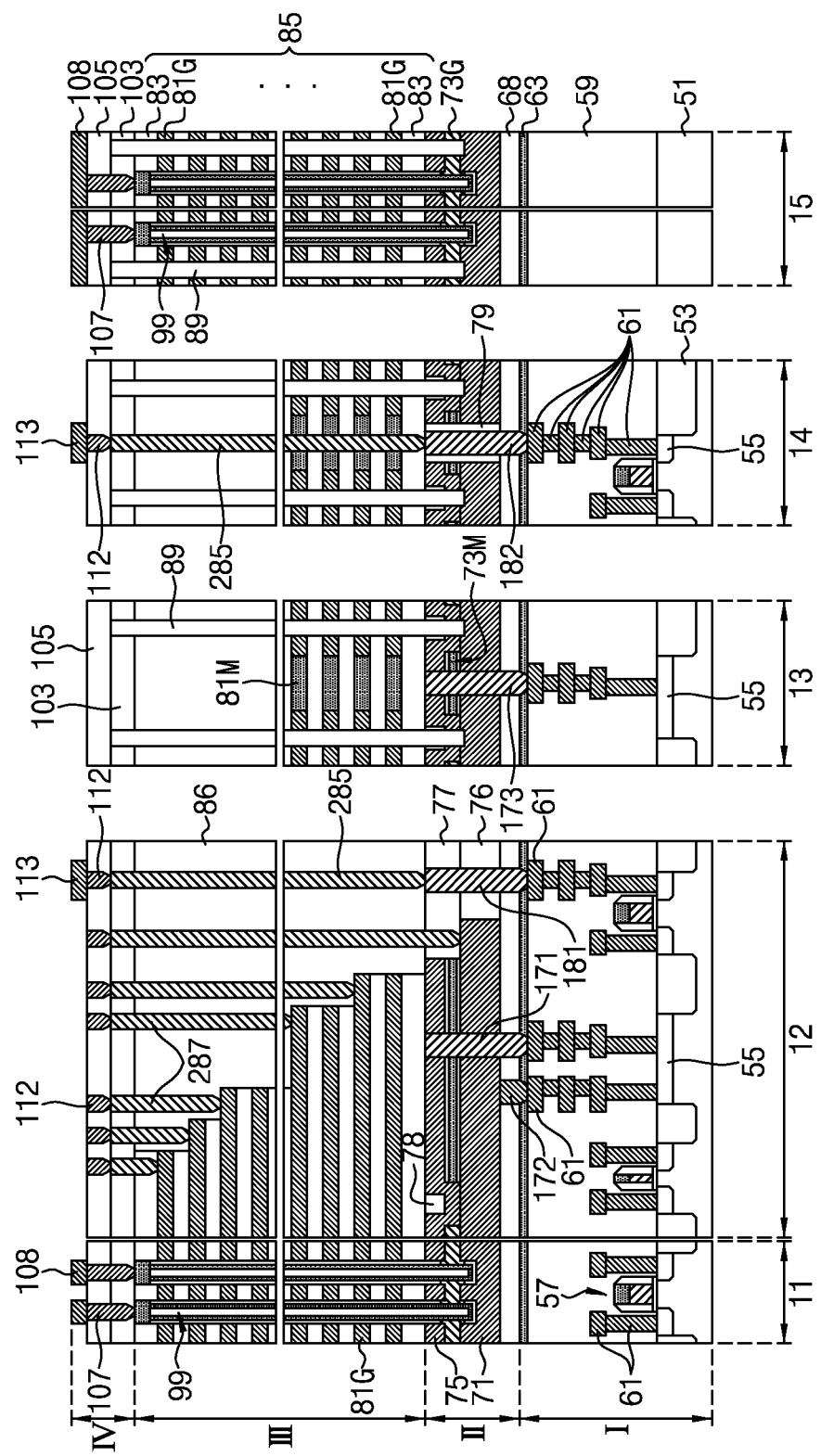
FIGS. 1, 2, 3, 4, 5, 6, 7, 8, 9, 10, 11, 12, 13, 14, 15, 16, 17, 18, 19, 20, 21, 22, 23, 24 and 25 are respective, cross-sectional diagrams illustrating various semiconductor devices according to embodiments of the inventive concept.
Figure 2:
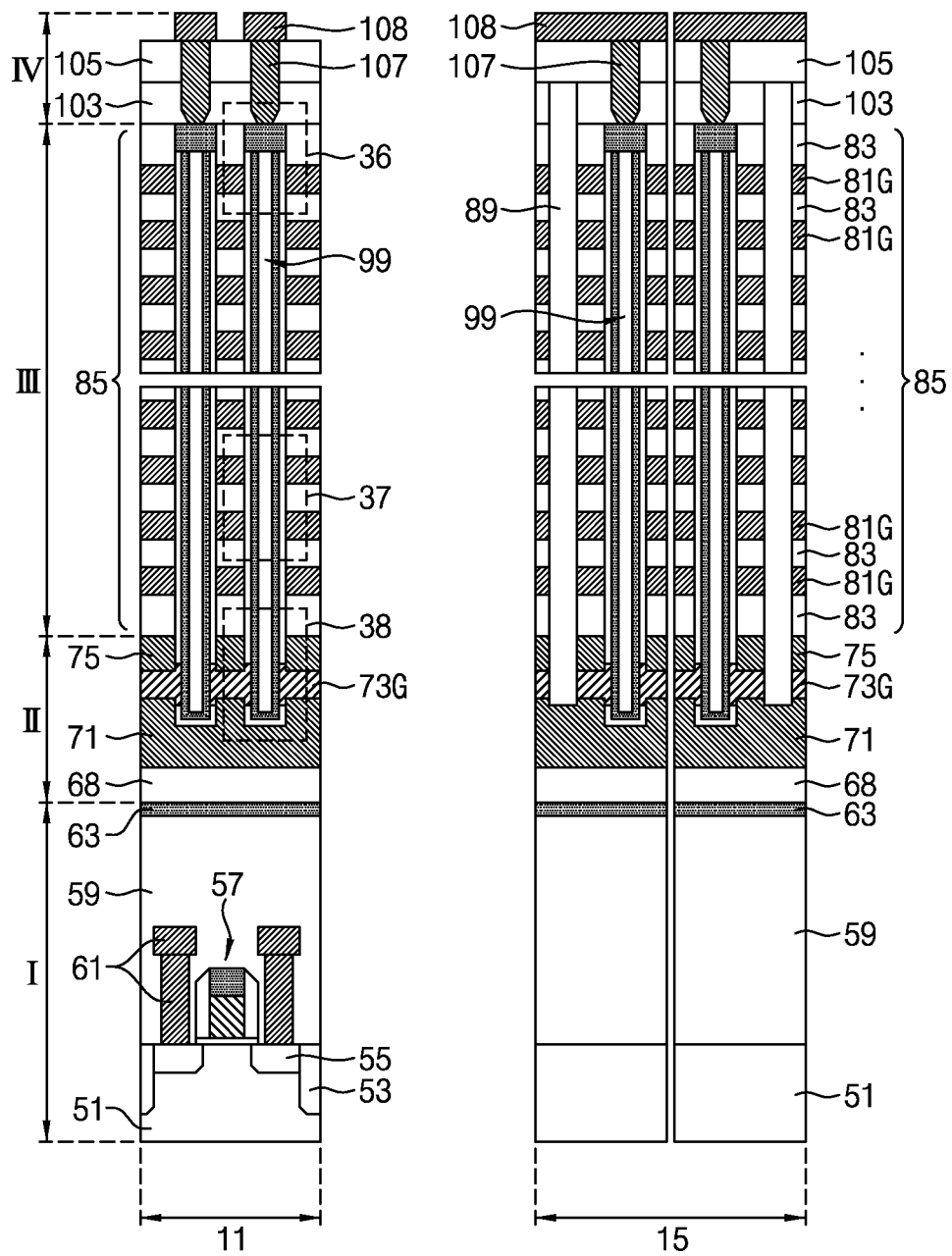
Figure 3:
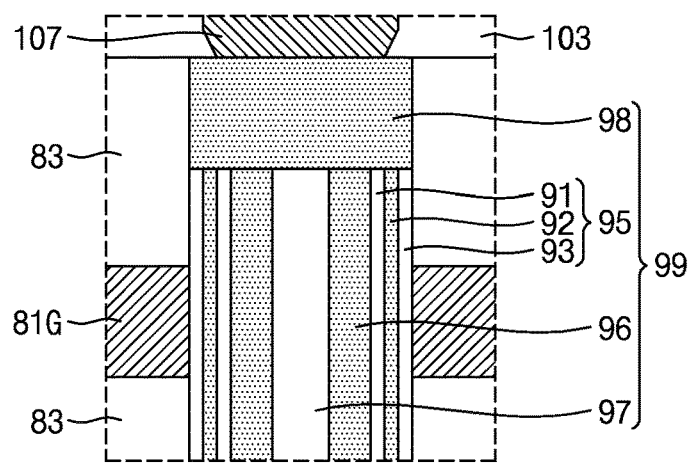
Figure 4:
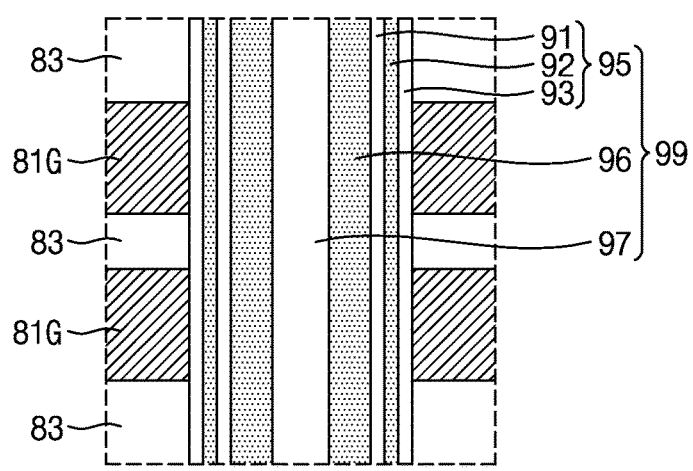
Figure 5:
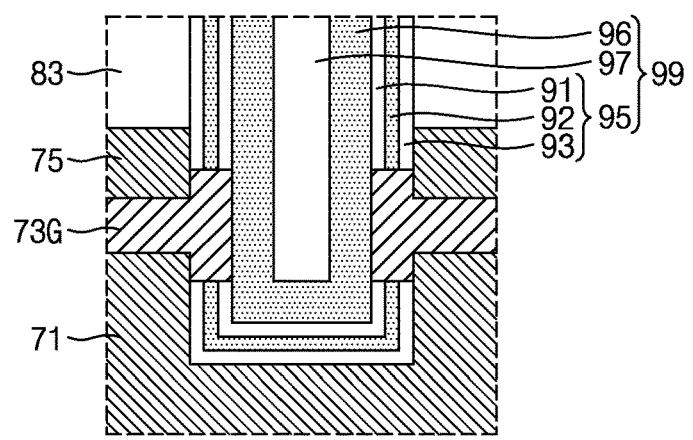
Figure 6:
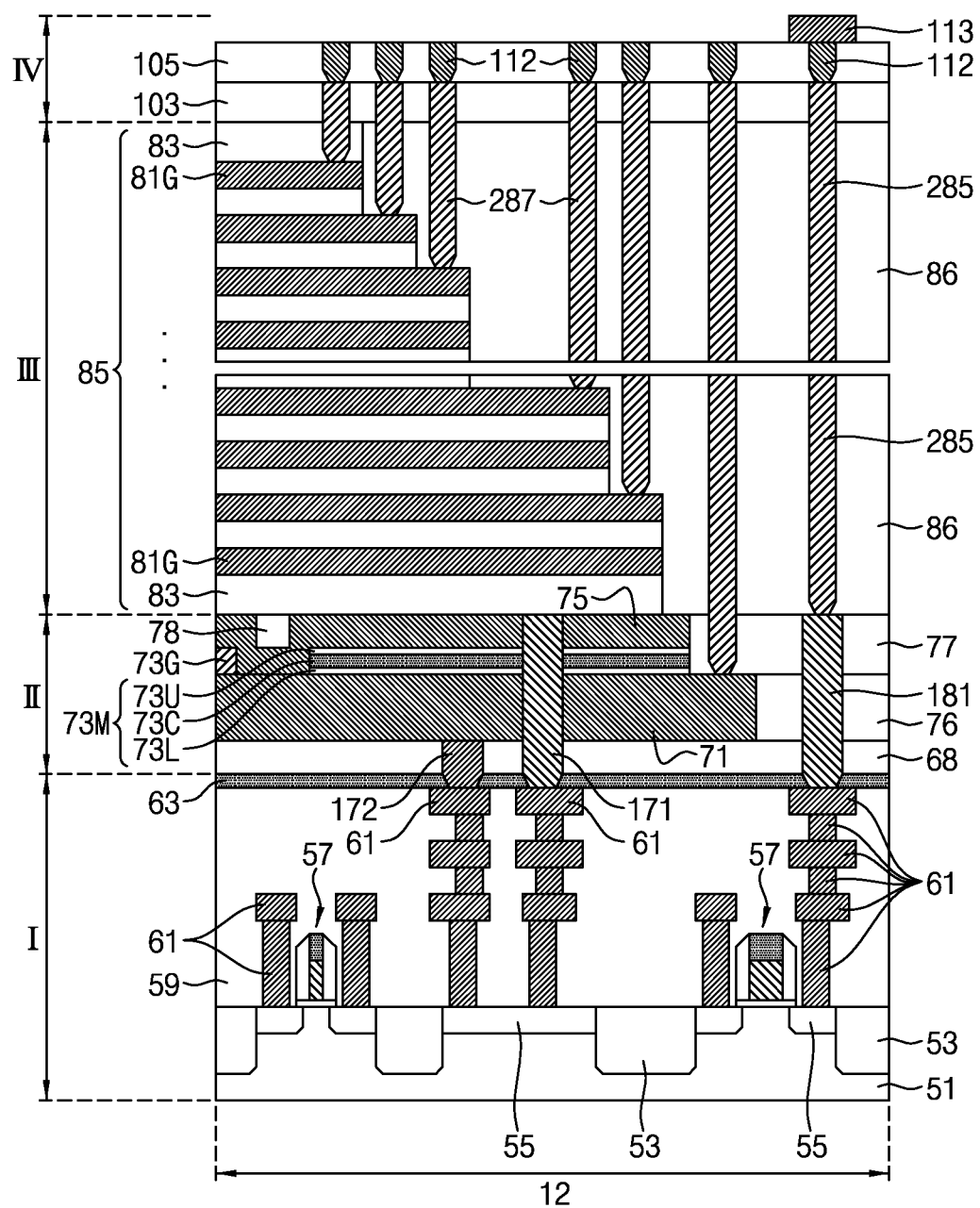
Figure 16:
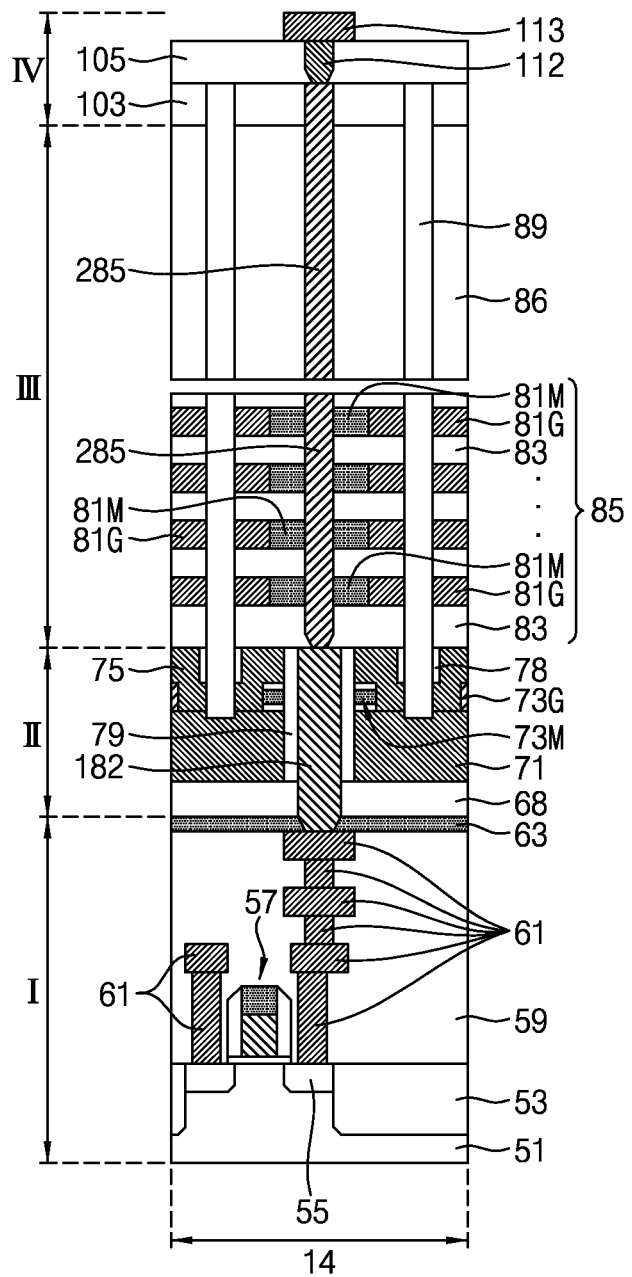
Figure 17:
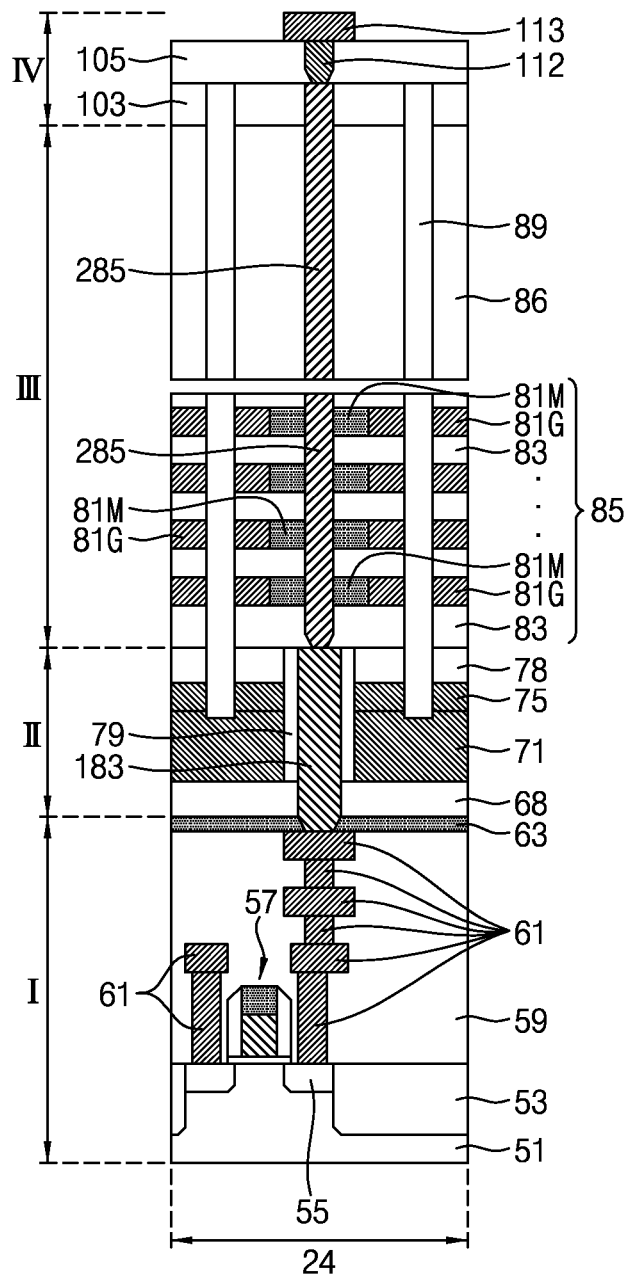
Figure 18:
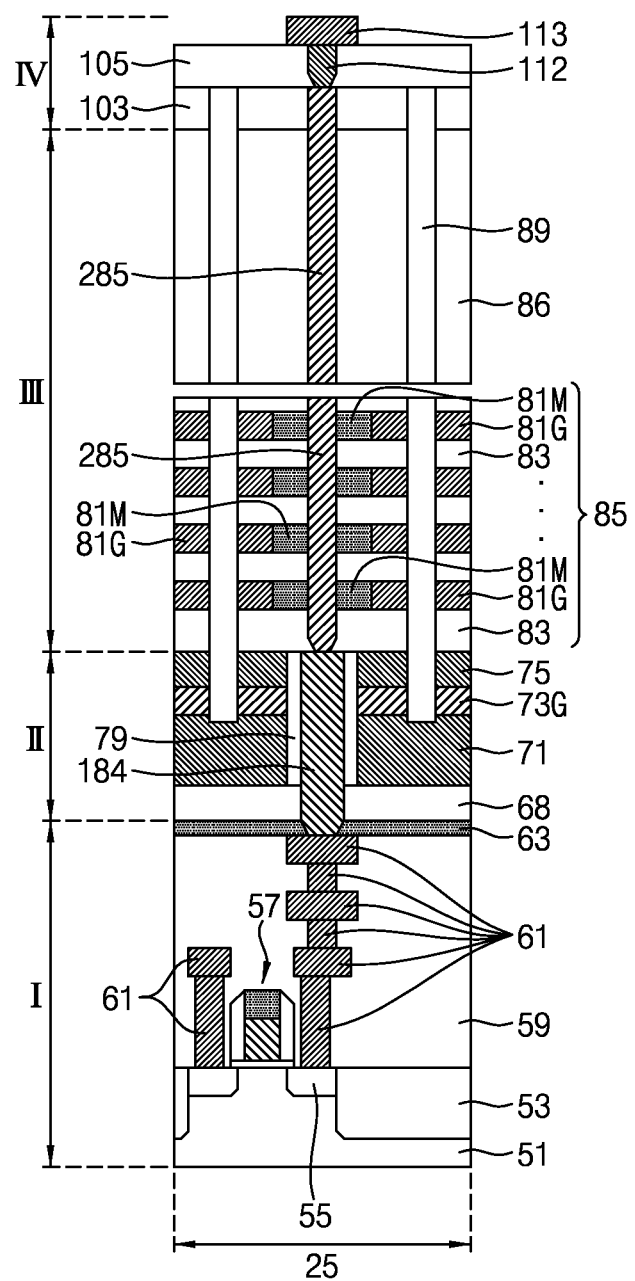
Figure 19:
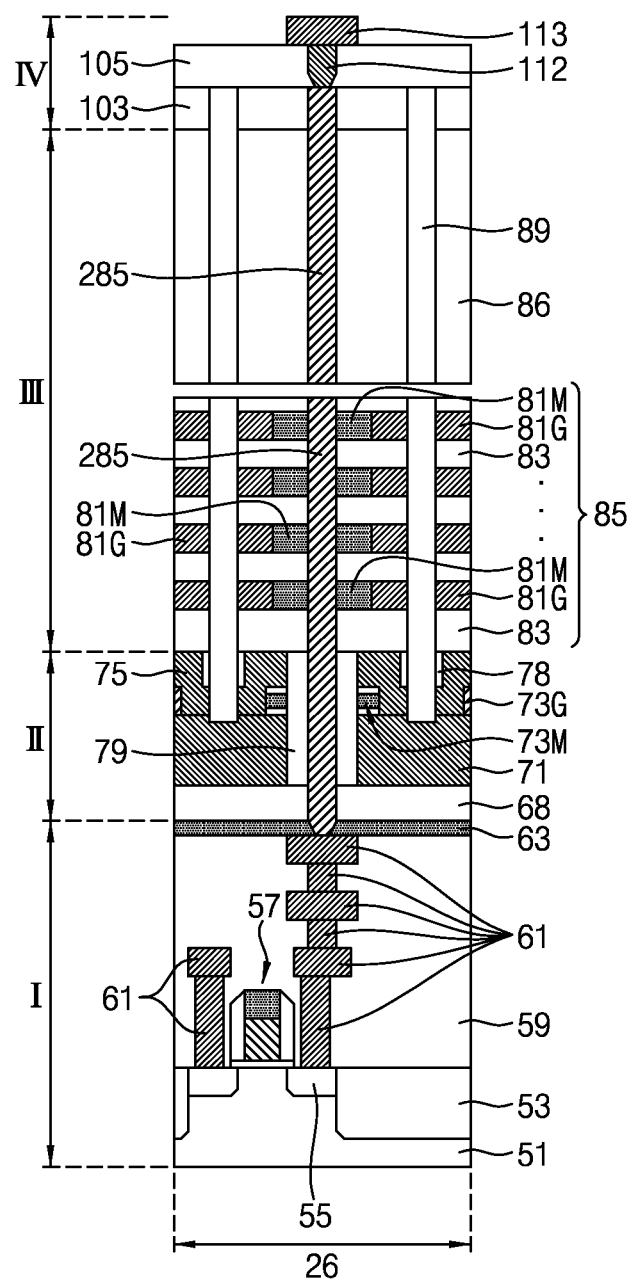

FIG. 1 is a cross-sectional diagram illustrating semiconductor devices according to embodiments of the inventive concept; FIG. 2 is an enlarged diagram further illustrating portions 11 and 15 of FIG. 1; FIG. 3 is an enlarged diagram further illustrating portion 36 of FIG. 2; FIG. 4 is an enlarged diagram further illustrating portion 37 of FIG. 2; FIG. 5 is an enlarged diagram further illustrating portion 38 of FIG. 2; and FIG. 6 is an enlarged diagram further illustrating portion 12 of FIG. 1. FIGS. 7, 8, 9, and 10 are cross-sectional diagrams illustrating various semiconductor devices according to embodiments of the inventive concept. FIG. 11 is an enlarged diagram further illustrating portion 13 of FIG. 1. FIGS. 12, 13, 14 and 15 are cross-sectional diagrams illustrating various semiconductor devices according to embodiments of the inventive concept. FIG. 16 is an enlarged diagram further illustrating portion 14 of FIG. 1. FIGS. 17, 18 and 19 are cross-sectional diagrams illustrating various semiconductor devices according to embodiments of the inventive concept.

Semiconductor devices according to embodiments of the inventive concept may include non-volatile memories, such as a vertical NAND (VNAND) or three-dimensional (3D) flash memory. Certain semiconductor devices according to embodiments of the inventive concept may have a cell on peripheral (COP) structure.

Referring to FIG. 1, semiconductor devices according to embodiments of the inventive concept may include a substrate 51 including first to fifth regions, respectively 11, 12, 13, 14 and 15, a lower circuit structure I on the substrate 51, a middle wiring structure II on the lower circuit structure I, a middle circuit structure III on the middle wiring structure II, an upper wiring structure IV on the middle circuit structure III. Here, the first region 11 and the fifth region 15 may correspond to respective cell regions, and the second region 12, the third region 13, and the fourth region 14 may correspond to respective extension regions. In the illustrated example of FIG. 1, the second region 12, the third region 13, and the fourth region 14 have side surface continuity with the first region 11 and/or the fifth region 15.

Semiconductor devices according to embodiments of the inventive concept may further include isolation patterns 89, channel structures 99, contact plugs 171, 172 and 173 (hereafter, "171 to 173"), relay plugs (i.e., conductive plugs) 181 and 182, through vias 285, and cell contact plugs 287.

The lower circuit structure I may include an isolation layer 53, impurity regions 55, transistors 57, a first lower insulation layer 59, lower conductive patterns 61, and a second lower insulation layer 63. The second lower insulation layer 63 may correspond to a capping layer or an etch stop layer. The middle wiring structure II may include a first middle insulation layer 68, a horizontal wiring 71, a connection electrode layer 73G, a connection mold layer 73M, a supporter 75, a second middle insulation layer 76, a third middle insulation layer 77, a first buried insulation pattern 78, and a second buried insulation pattern 79. The connection electrode layer 73G and the connection mold layer 73M may configure a connection wiring layer 73G and 73M.

The middle circuit structure III may include a stacked structure 85 and an interlayer insulation layer 86. The stacked structure 85 may include wiring layers 81G and 81M and insulation layers 83, which are repeatedly and alternately stacked. The wiring layers 81G and 81M may include electrode layers 81G and mold layers 81M. The upper wiring structure IV may include a first upper insulation layer 103, a second upper insulation layer 105, bit plugs 107, bit lines 108, upper plugs 112, and upper wirings 113.

The contact plugs 171 to 173 may include a first contact plug 171, a second contact plug 172, and a third contact plug 173. The relay plugs 181 and 182 may include a first relay plug 181 and a second relay plug 182. The channel structures 99 may extend to an inner portion of the stacked structure 85 and may be connected to the horizontal wiring 71. A lowermost end of each channel structure 99 may be relatively farther away from a top surface of the substrate 51 than a bottom surface of the horizontal wiring 71. An uppermost end of each contact plug 171 to 173 may be relatively farther away from the top surface of the substrate 51 than the bottom surface of the horizontal wiring 71, and the uppermost end of each contact plug 171 to 173 may be disposed relatively closer to the top surface of the substrate 51 than a lowermost end of each wiring layer 81G and 81M.

In an embodiment, the horizontal wiring 71 may correspond to a source line or a common source line (CSL). At least one (e.g., one adjacent to a lowermost end of the stacked structure 85) of the electrode layers 81G and at least one (e.g., one adjacent to an uppermost end of the stacked structure 85) of the electrode layers 81G may respectively correspond to a gate-induced drain leakage (GIDL) control line. Some electrode layers 81G may each correspond to a word line or a dummy word line. At least one (e.g., one adjacent to the lowermost end of the stacked structure 85 and disposed between the GIDL control line and the word line) of the electrode layers 81G may correspond to a ground selection line (GSL). At least one (e.g., one adjacent to the uppermost end of the stacked structure 85 and disposed between the GIDL control line and the word line) of the electrode layers 81G may correspond to a string selection line (SSL).

Referring to FIG. 2, semiconductor devices according to embodiments of the inventive concept may include a substrate 51 including a first region 11 and a fifth region 15, a lower circuit structure I on the substrate 51, a middle wiring structure II on the lower circuit structure III may, a middle circuit structure III on the middle wiring structure II, an upper wiring structure IV on the middle circuit structure III, isolation patterns 89, and channel structures 99. In an embodiment, the fifth region 15 may be adjacent to the first region 11. The fifth region 15 may be a cross-sectional view taken along a direction intersecting with the first region 11.

The lower circuit structure I may include an isolation layer 53, impurity regions 55, a transistor 57, a first lower insulation layer 59, lower conductive patterns 61, and a second lower insulation layer 63. The middle wiring structure II may include a first middle insulation layer 68, a horizontal wiring 71, a connection electrode layer 73G, and a supporter 75. The middle circuit structure III may include a stacked structure 85 including electrode layers 81G and insulation layers 83 which are repeatedly and alternately stacked. The electrode layers 81G may correspond to portions of the wiring layers (e.g., 81G and 81M of FIG. 1). The upper wiring structure IV may include a first upper insulation layer 103, a second upper insulation layer 105, bit plugs 107 and bit lines 108.

The bit plugs 107 may pass through the second upper insulation layer 105 and the first upper insulation layer 103 in order to connect the channel structures 99. The bit lines 108 may be disposed on the second upper insulation layer 105. The bit lines 108 may directly contact the bit plugs 107. The isolation patterns 89 may pass through the first upper insulation layer 103, the middle circuit structure III, the supporter 75, and the connection electrode layer 73G, thereby extending to an inner portion of the horizontal wiring 71.

Referring to FIG. 3, a channel structure 99 may include a core pattern 97, a channel layer 96 surrounding an outer portion of the core pattern 97, an information storage pattern 95 at least partially surrounding an outer portion of the channel layer 96, and a bit pad 98 on the channel layer 96. The information storage pattern 95 may include a tunnel insulation layer 91 surrounding an outer portion of the channel layer 96, a charge storage layer 92 surrounding an outer portion of the tunnel insulation layer 91, and a blocking layer 93 surrounding an outer portion of the charge storage layer 92. The channel structure 99 may pass through an electrode layer 81G and insulation layers 83. A bit plug 107 may pass through a first upper insulation layer 103 and may contact the bit pad 98 of the channel structure 99.

The tunnel insulation layer 91 may include an insulation layer such as silicon oxide. The charge storage layer 92 may include an insulation layer such as silicon nitride. The blocking layer 93 may include silicon oxide, silicon nitride, silicon oxynitride, high-k dielectrics or a combination thereof. The channel layer 96 may include polysilicon, amorphous silicon, single crystalline silicon or a combination thereof. The core pattern 97 may include silicon oxide, silicon nitride, silicon oxynitride, low-k dielectrics, high-k dielectrics, polysilicon or a combination thereof. The bit pad 98 may include metal, metal nitride, metal oxide, metal silicide, conductive carbon, polysilicon or a combination thereof.

Referring to FIG. 4, electrode layers 81G and insulation layers 83 may be repeatedly and alternately stacked. The channel structure 99 may pass through the electrode layers 81G and the insulation layers 83.

Referring to FIG. 5, a connection electrode layer 73G may be disposed between a horizontal wiring 71 and a supporter 75. An insulation layer 83 may be disposed on the supporter 75. A channel structure 99 may pass through the insulation layer 83 and the supporter 75, thereby extending to an inner portion of the horizontal wiring 71. The connection electrode layer 73G may pass through a side surface of the information storage pattern 95 in order to directly contact a side surface of the channel layer 96. A lowermost end of the channel structure 99 may be disposed at a level that is higher than a bottom surface of the horizontal wiring 71. The channel layer 96 may be electrically connected to the horizontal wiring 71 via the connection electrode layer 73G.

Referring to FIG. 6, semiconductor devices according to embodiments of the inventive concept may include a substrate 51 including a second region 12, a lower circuit structure I on the substrate 51, a middle wiring structure II on the lower circuit structure I on, a middle circuit structure III on the middle wiring structure II, an upper wiring structure IV on the middle circuit structure III, a first contact plug 171, a second contact plug 172, a first relay plug 181, a through via 285, and cell contact plugs 287. In the illustrated example of FIG. 6, the second region 12 has side surface continuity with the first region (e.g., 11 of FIG. 1).

The lower circuit structure I may include an isolation layer 53, impurity regions 55, transistors 57, a first lower insulation layer 59, lower conductive patterns 61, and a second lower insulation layer 63. The middle wiring structure II may include a first middle insulation layer 68, a horizontal wiring 71, a connection electrode layer 73G, a connection mold layer 73M, a supporter 75, a second middle insulation layer 76, a third middle insulation layer 77, and a first buried insulation pattern 78.

The connection electrode layer 73G and the connection mold layer 73M may be configured to form a connection wiring layer 73G and 73M. The connection mold layer 73M may be disposed at substantially the same level as the connection electrode layer 73G. The connection mold layer 73M may have substantially the same thickness as that of the connection electrode layer 73G. The connection mold layer 73M may include a lower mold layer 73L, an upper mold layer 73U on the lower mold layer 73L, and a middle mold layer 73C between the lower mold layer 73L and the upper mold layer 73U. The middle mold layer 73C may include a material having an etch selectivity with respect to the lower mold layer 73L and the upper mold layer 73U. For example, each of the lower mold layer 73L and the upper mold layer 73U may include silicon oxide. The middle mold layer 73C may include silicon nitride.

A portion of the supporter 75 may pass through the connection wiring layer 73G and 73M in order to directly contact a top surface of the horizontal wiring 71. The supporter 75 may directly contact side surfaces of the connection electrode layer 73G and the connection mold layer 73M. The first buried insulation pattern 78 may be disposed on the supporter 75.

The first contact plug 171 may pass through the supporter 75, the connection mold layer 73M, the horizontal wiring 71, the first middle insulation layer 68, and the second lower insulation layer 63 in order to directly and respectively contact the lower conductive patterns 61. The second contact plug 172 may pass through the first middle insulation layer 68 and the second lower insulation layer 63 in order to directly and respectively contact the lower conductive patterns 61. The second contact plug 172 may directly contact a bottom surface of the horizontal wiring 71.

The first relay plug 181 may pass through the third middle insulation layer 77, the second middle insulation layer 76, the first middle insulation layer 68, and the second lower insulation layer 63 in order to directly and respectively contact the lower conductive patterns 61. Top surfaces of the first contact plug 171, the first relay plug 181, the supporter 75, the third middle insulation layer 77, and the first buried insulation pattern 78 may be substantially coplanar with one another.

The middle circuit structure III may include a stacked structure 85 and an interlayer insulation layer 86. The stacked structure 85 may include electrode layers 81G and insulation layers 83, which are repeatedly and alternately stacked. The electrode layers 81G may correspond to portions of the wiring layers (e.g., 81G and 81M of FIG. 1). The interlayer insulation layer 86 may have side surface continuity with the stacked structure 85. Here, the side surface of the stacked structure 85 may have a stair-stepped shape. The interlayer insulation layer 86 may at least partially cover a top surface of the stacked structure 85.

The upper wiring structure IV may include a first upper insulation layer 103, a second upper insulation layer 105, upper plugs 112, and an upper wiring 113. The upper wiring 113 may be disposed on the second upper insulation layer 105. The upper wiring 113 may directly contact corresponding one of the upper plugs 112.

The through via 285 may pass through the first upper insulation layer 103 and the interlayer insulation layer 86 in order to directly contact the first relay plug 181. The cell contact plugs 287 may pass through the first upper insulation layer 103 and the interlayer insulation layer 86 in order to directly and respectively contact the electrode layers 81G. Top surfaces of the through via 285, the cell contact plugs 287, and the first upper insulation layers 103 may be substantially coplanar with one another.

At least one upper plug 112 selected from among the upper plugs 112 may pass through the second insulation layer 105 to directly contact the through via 285. Some of the upper plugs 112 may pass through the second upper insulation layer 105 to directly contact one of the cell contact plugs 287.

Figure 7:
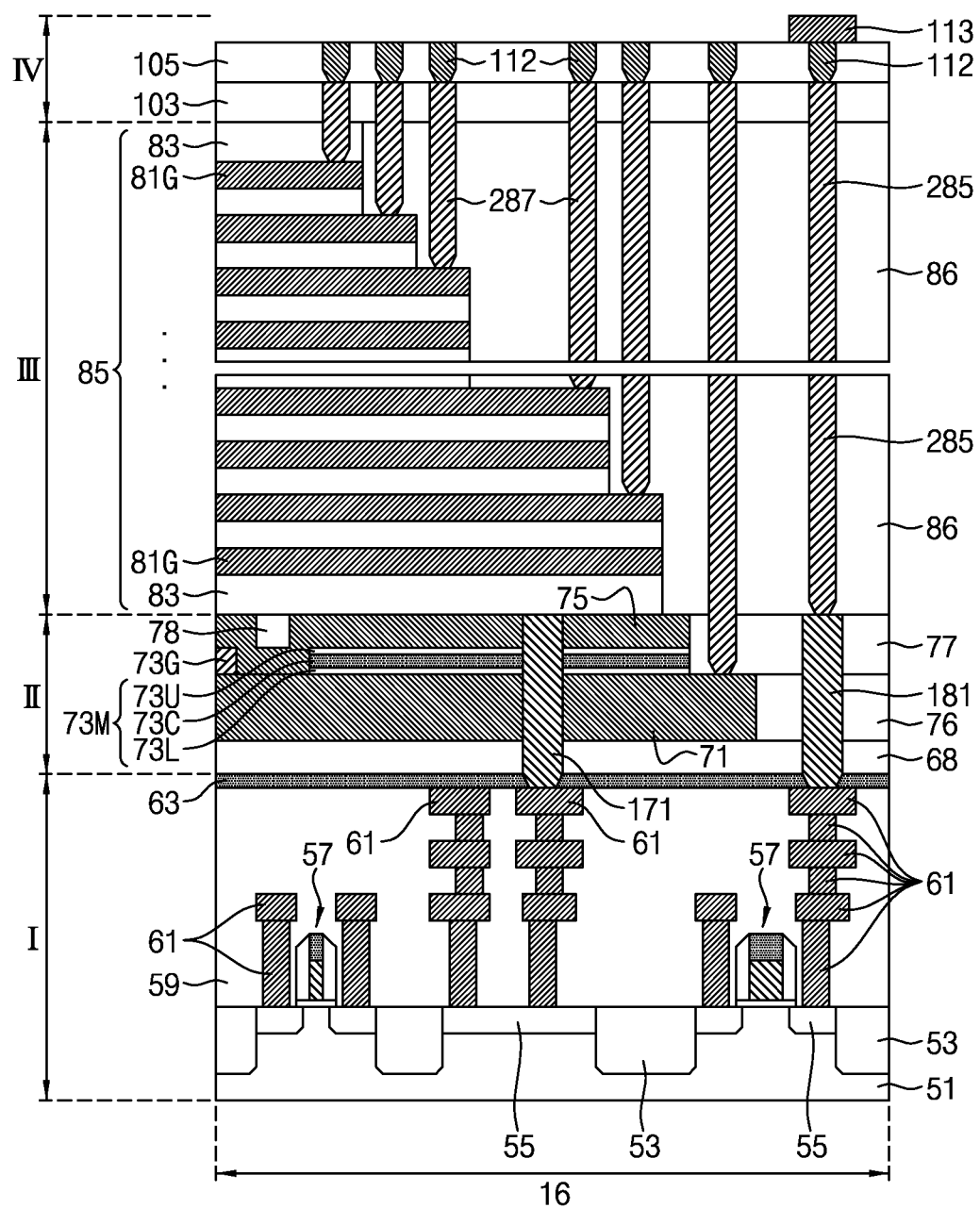

Referring to FIG. 7, semiconductor devices according to embodiments of the inventive concept may include a substrate 51 including a sixth region 16, a first contact plug 171, and a first relay plug 181. Here, the second contact plug (e.g., 172 of FIG. 1) may be omitted. The sixth region 16 may be adjacent to the second region (e.g., 12 of FIG. 1), or may be configured similarly as the second region (e.g., 12 of FIG. 1). The sixth region 16 may correspond to an extension region.

Figure 8:
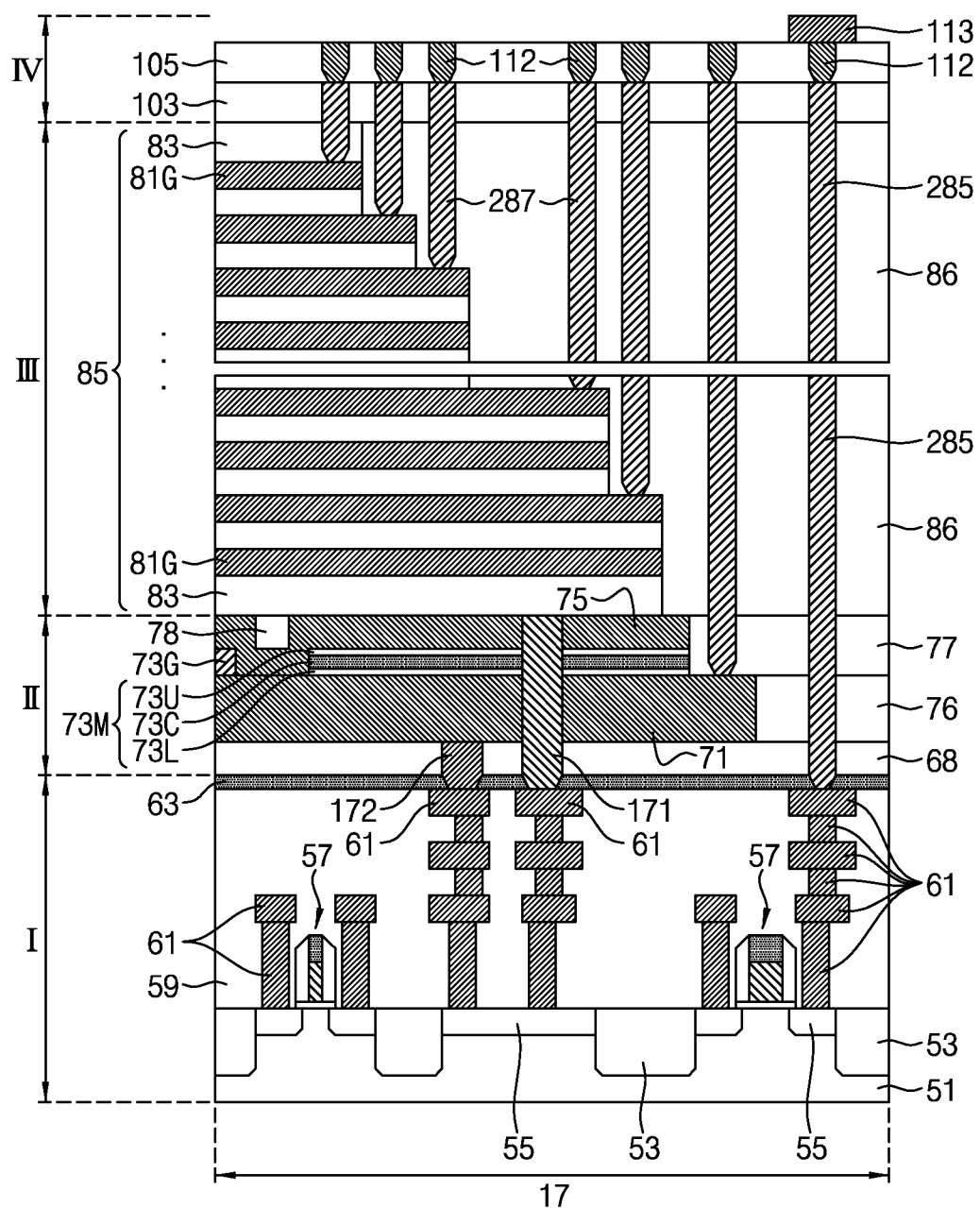

Referring to FIG. 8, semiconductor devices according to embodiments of the inventive concept may include a substrate 51 including a seventh region 17, a first contact plug 171, a second contact plug 172, and a through via 285. The through via 285 may pass through a first upper insulation layer 103, an interlayer insulation layer 86, a third middle insulation layer 77, a second middle insulation layer 76, a first middle insulation layer 68, and a second lower insulation layer 63 in order to directly and respectively contact the lower conductive patterns 61. Here, the first relay plug (e.g., 181 of FIG. 1) may be omitted. The seventh region 17 may be adjacent to the second region (e.g., 12 of FIG. 1), or may be similarly configured as the second region (e.g., 12 of FIG. 1). The seventh region 17 may correspond to an extension region.

Figure 9:
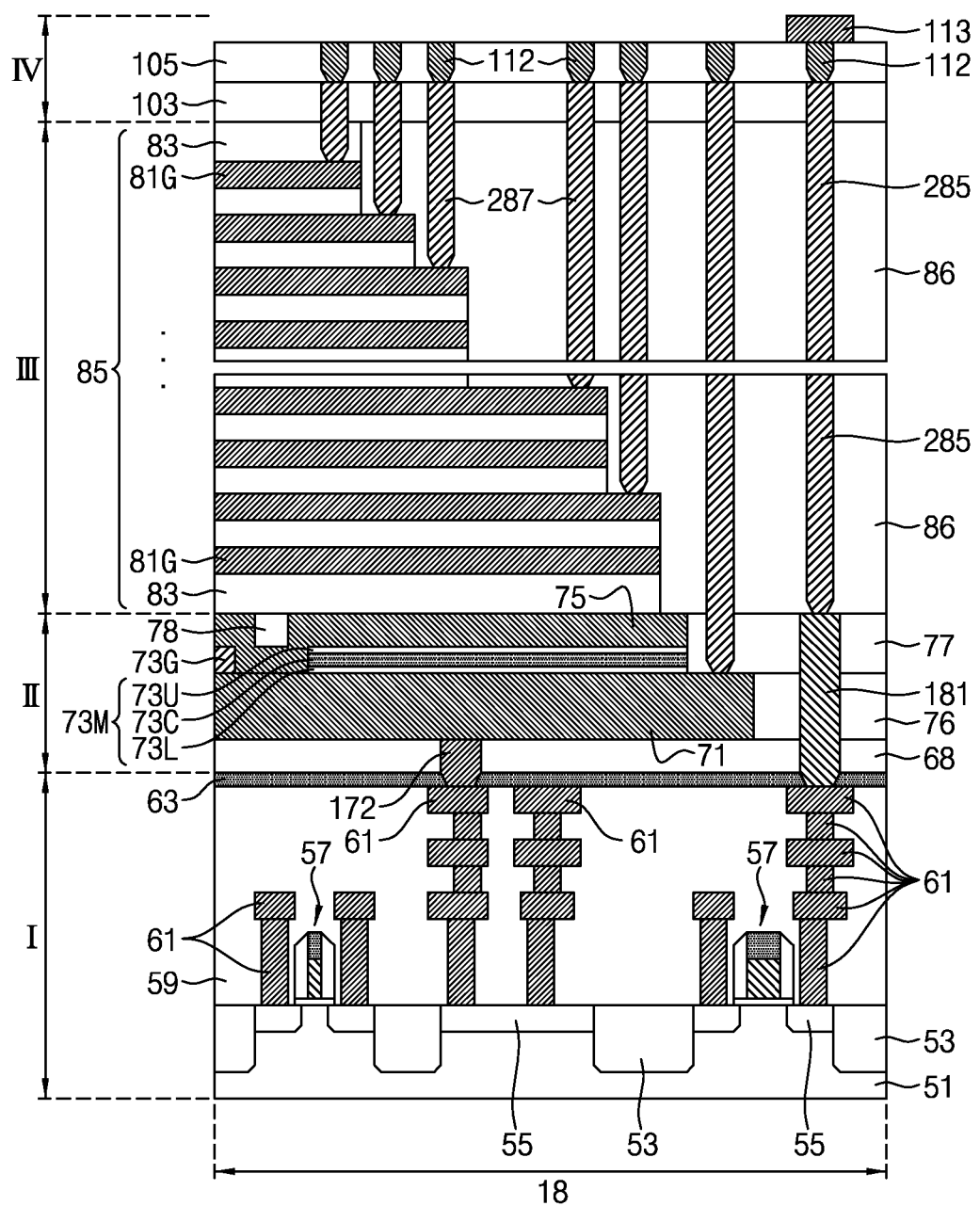

Referring to FIG. 9, semiconductor devices according to embodiments of the inventive concept may include a substrate 51 including an eighth region 18, a second contact plug 172, and a first relay plug 181. Here again, the first contact plug (e.g., 171 of FIG. 1) may be omitted. The eighth region 18 may be adjacent to the second region (e.g., 12 of FIG. 1), or may similarly configured as the second region (e.g., 12 of FIG. 1). The eighth region 18 may correspond to an extension region.

Figure 10:
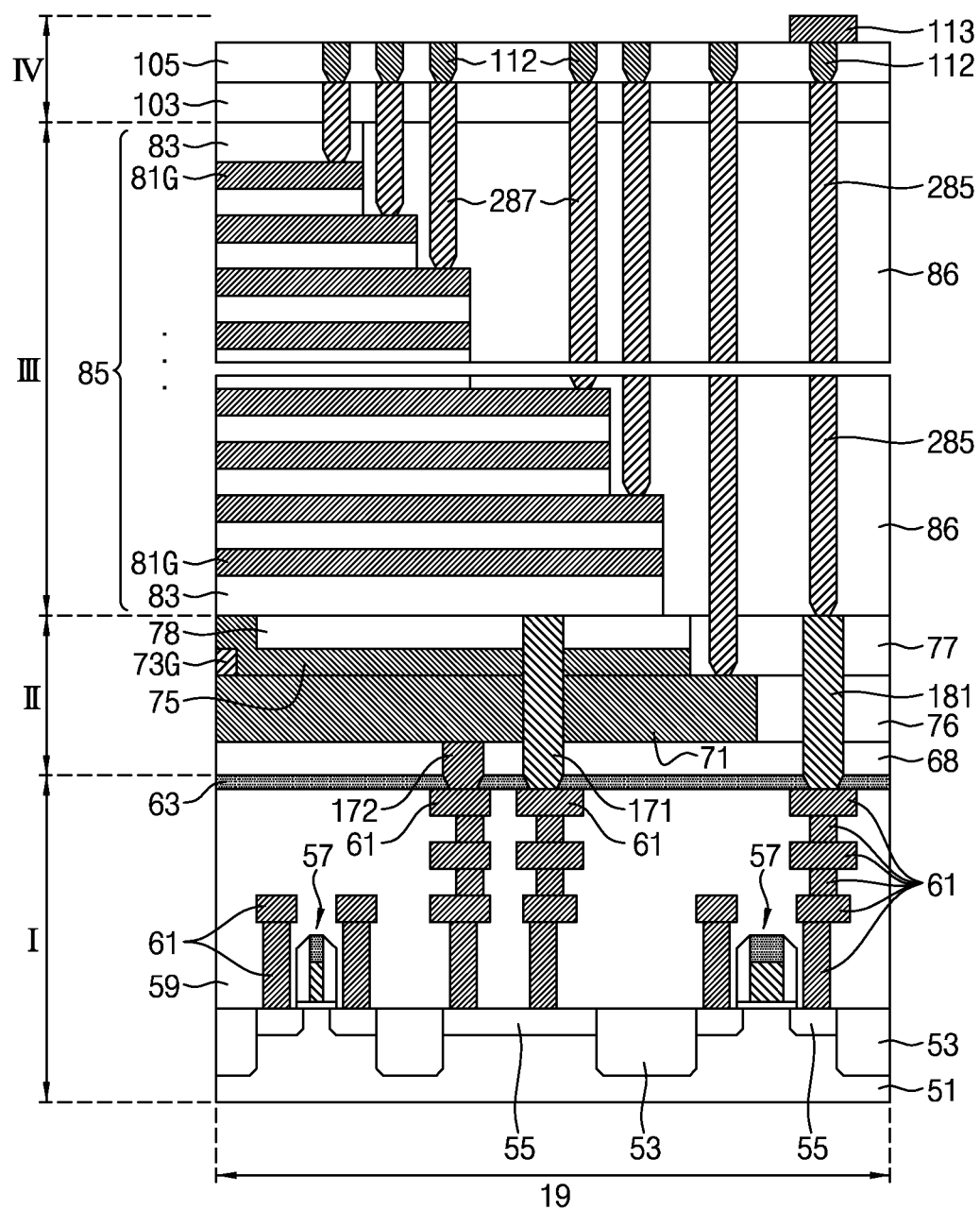
Figure 11:
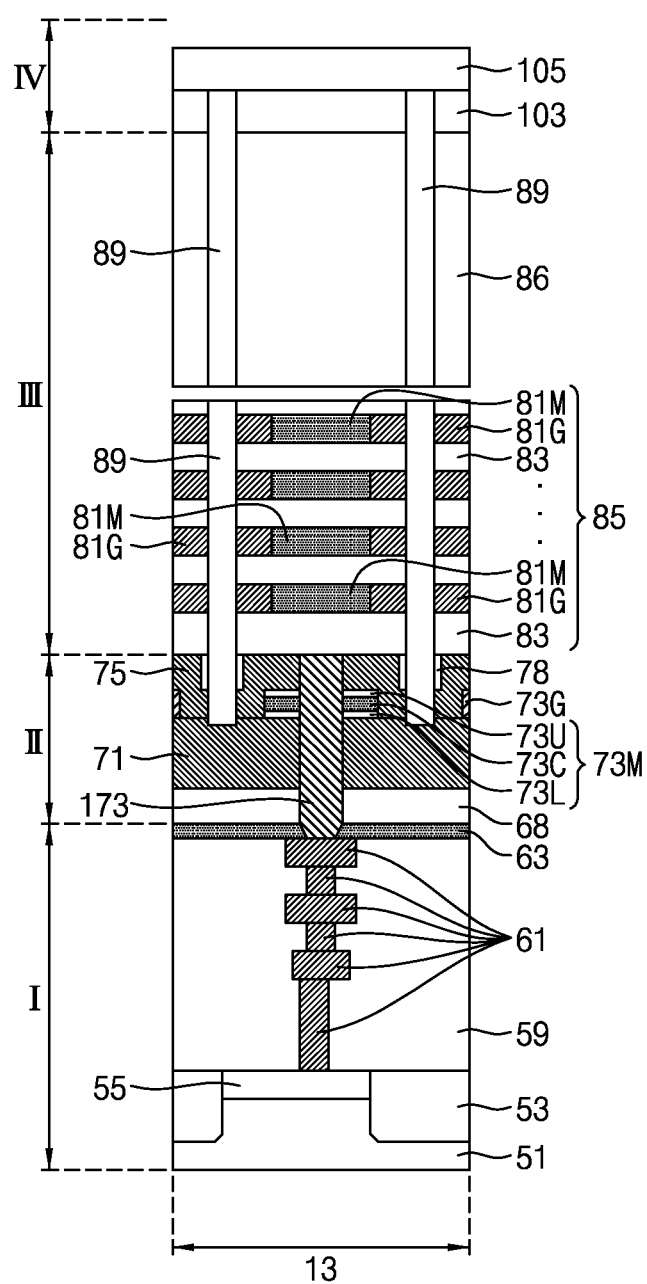

Referring to FIG. 10, semiconductor devices according to embodiments of the inventive concept may include a substrate 51 including a ninth region 19, a first contact plug 171, a second contact plug 172, and a first relay plug 181. The ninth region 19 may be adjacent to the second region (e.g., 12 of FIG. 1), or may similarly configured as the second region (e.g., 12 of FIG. 1). The ninth region 19 may correspond to an extension region.

A portion of the supporter 75 may directly contact a top surface of a horizontal wiring 71. A first buried insulation pattern 78 may be disposed on the supporter 75. The supporter 75 may directly contact a top surface and a side surface of a connection electrode layer 73G. A top surface of the first buried insulation pattern 78 may be substantially coplanar with an uppermost end of the supporter 75.

The first contact plug 171 may pass through the first buried insulation pattern 78, the supporter 75, the horizontal wiring 71, a first middle insulation layer 68, and a second lower insulation layer 63 in order to directly contact one lower conductive pattern 61 selected from among the lower conductive patterns 61. The first relay plug 181 may pass through a third middle insulation layer 77, a second middle insulation layer 76, a first middle insulation layer 68, and a second lower insulation layer 63 in order to directly contact another one lower conductive pattern 61 selected from among the lower conductive patterns 61. An uppermost end of the first contact plug 171, an uppermost end of the first relay plug 181, an uppermost end of the supporter 75, a top surface of the first buried insulation pattern 78, and a top surface of the third middle insulation layer 77 may be substantially coplanar with one another.

Referring to FIG. 11, semiconductor devices according to embodiments of the inventive concept may include a substrate 51 including a third region 13, a lower circuit structure I on the substrate 51, a middle wiring structure II on the lower circuit structure I, a middle circuit structure III on the middle wiring structure II, an upper wiring structure IV on the middle circuit structure III, isolation patterns 89, and a third contact plug 173. In the illustrated embodiment of FIG. 11, the third region 13 may be a cross-sectional view taken along a direction intersecting with the second region (e.g., 12 of FIG. 1).

The lower circuit structure I may include an isolation layer 53, an impurity region 55, a first lower insulation layer 59, lower conductive patterns 61, and a second lower insulation layer 63. The second lower insulation layer 63 may correspond to a capping layer or an etch stop layer.

The middle wiring structure II may include a first middle insulation layer 68, a horizontal wiring 71, a connection electrode layer 73G, a connection mold layer 73M, a supporter 75, and a first buried insulation pattern 78. The connection electrode layer 73G and the connection mold layer 73M may be configured as a connection wiring layer 73G and 73M. A portion of the supporter 75 may pass through the connection wiring layer 73G and 73M and may directly contact a top surface of the horizontal wiring 71. In an embodiment, a portion of the supporter 75 may pass through a region between the connection electrode layer 73G and the connection mold layer 73M to directly contact a top surface of the horizontal wiring 71. A portion of the supporter 75 may directly contact side surfaces of the connection electrode layer 73G and the connection mold layer 73M. A portion of the supporter 75 may directly contact side surfaces of a lower mold layer 73L, a middle mold layer 73C, and an upper mold layer 73U.

The middle circuit structure III may include a stacked structure 85 and an interlayer insulation layer 86. The stacked structure 85 may include wiring layers 81G and 81M and insulation layers 83, which are repeatedly and alternately stacked. The wiring layers 81G and 81M may include electrode layers 81G and mold layers 81M. Each of the mold layers 81M may have side surface continuity with one of the electrode layers 81G. Each of the mold layers 81M may have substantially the same thickness as that of a corresponding one of the electrode layers 81G. The interlayer insulation layer 86 may be disposed on the stacked structure 85. The upper wiring structure IV may include a first upper insulation layer 103 and a second upper insulation layer 105.

The third contact plug 173 may pass through the supporter 75, the connection mold layer 73M, the horizontal wiring 71, the first middle insulation layer 68, and the second lower insulation layer 63 and may directly contact one lower conductive pattern 61 selected from among the lower conductive patterns 61. Top surfaces of the third contact plug 173, the supporter 75, and the first buried insulation layer 78 may be substantially coplanar with one another.

Figure 12:
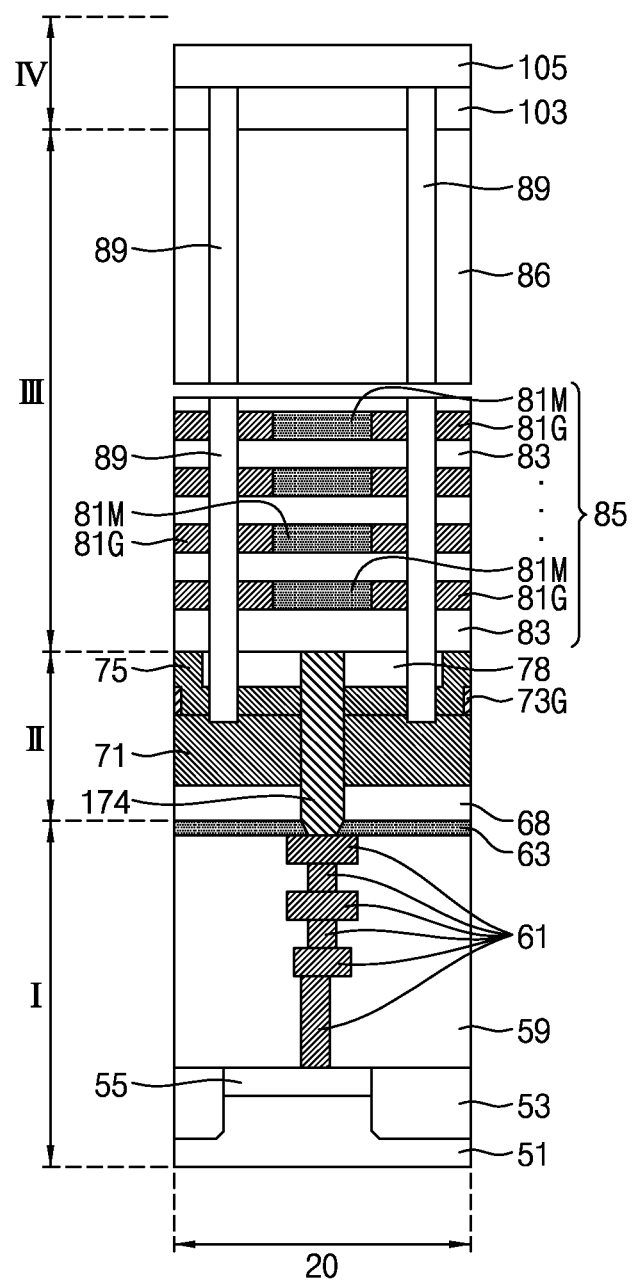

Referring to FIG. 12, semiconductor devices according to embodiments of the inventive concept may include a substrate 51, including a tenth region 20, and a fourth contact plug 174. The tenth region 20 may be adjacent to the second region (e.g., 12 of FIG. 1) or the third region (e.g., 13 of FIG. 1) or may be similarly configured as the second region (e.g., 12 of FIG. 1) or the third region (e.g., 13 of FIG. 1). The tenth region 20 may correspond to an extension region.

A portion of the supporter 75 may directly contact a top surface of a horizontal wiring 71. A first buried insulation pattern 78 may be disposed on the supporter 75. The supporter 75 may directly contact a top surface and a side surface of a connection electrode layer 73G. A top surface of the first buried insulation pattern 78 may be substantially coplanar with an uppermost end of the supporter 75. The fourth contact plug 174 may pass through the first buried insulation pattern 78, the supporter 75, the horizontal wiring 71, a first middle insulation layer 68, and a second lower insulation layer 63 and may directly contact one lower conductive pattern 61 selected from among the lower conductive patterns 61. An uppermost end of the fourth contact plug 174, an uppermost end of the supporter 75, and a top surface of the first buried insulation pattern 78 may be substantially coplanar with one another.

Figure 13:
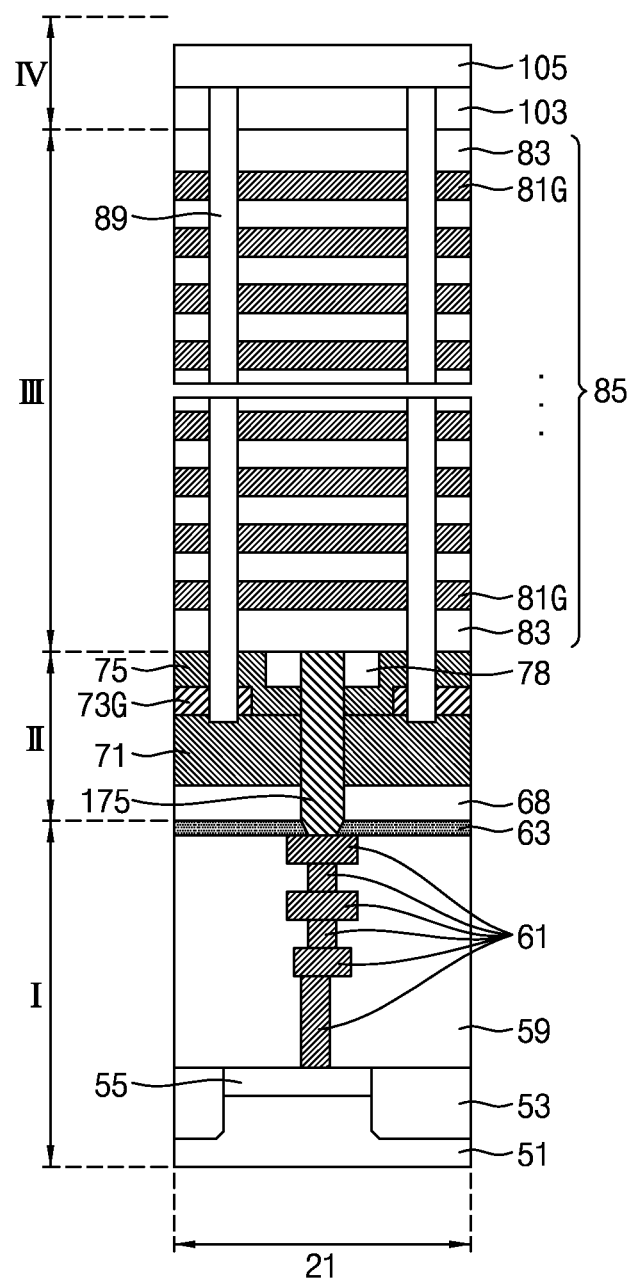

Referring to FIG. 13, semiconductor devices according to embodiments of the inventive concept may include a substrate 51, including an eleventh region 21, and a fifth contact plug 175. The eleventh region 21 may be adjacent to the first region (11 of FIG. 1) or the fifth region (e.g., 15 of FIG. 1) or may be similarly configured as the first region (e.g., 11 of FIG. 1) or the fifth region (e.g., 15 of FIG. 1). The eleventh region 21 may correspond to a cell region. A middle circuit structure III may include a stacked structure 85 including electrode layers 81G and insulation layers 83, which are repeatedly and alternately stacked. The electrode layers 81G may correspond to some portions of the wiring layers (e.g., 81G and 81M of FIG. 1).

A portion of the supporter 75 may directly contact a top surface of a horizontal wiring 71. A first buried insulation pattern 78 may be disposed on the supporter 75. The supporter 75 may directly contact a top surface and a side surface of a connection electrode layer 73G. A top surface of the first buried insulation pattern 78 may be substantially coplanar with an uppermost end of the supporter 75. The fifth contact plug 175 may pass through the first buried insulation pattern 78, the supporter 75, the horizontal wiring 71, a first middle insulation layer 68, and a second lower insulation layer 63 in order to directly contact one lower conductive pattern 61 selected from among the lower conductive patterns 61. An uppermost end of the fifth contact plug 175, an uppermost end of the supporter 75, and a top surface of the first buried insulation pattern 78 may be substantially coplanar with one another.

Figure 14:
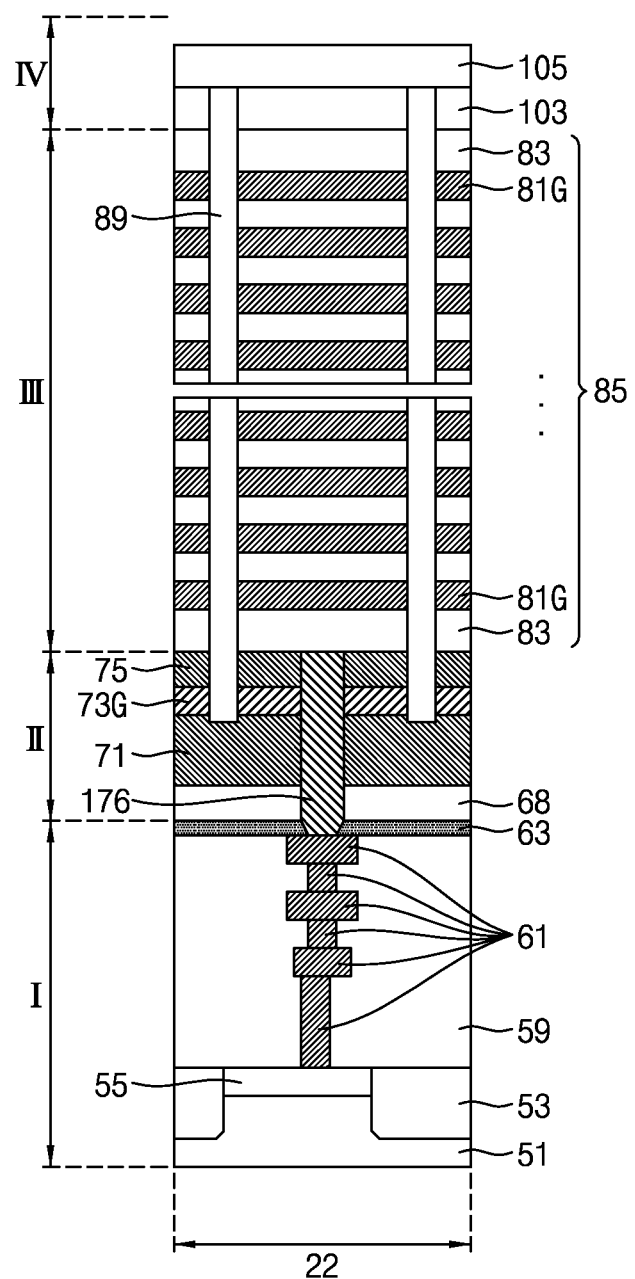

Referring to FIG. 14, semiconductor devices according to embodiments of the inventive concept may include a substrate 51, including a twelfth region 22, and a sixth contact plug 176. The twelfth region 22 may be adjacent to the first region (e.g., 11 of FIG. 1) or the fifth region (e.g., 15 of FIG. 1) or may be similarly configured as the first region (e.g., 11 of FIG. 1) or the fifth region (e.g., 15 of FIG. 1). The twelfth region 22 may correspond to a cell region.

A connection electrode layer 73G may be disposed between a supporter 75 and a horizontal wiring 71. The sixth contact plug 176 may pass through the supporter 75, the connection electrode layer 73G, the horizontal wiring 71, the first middle insulation layer 68, and the second lower insulation layer 63 in order to directly contact one lower conductive pattern 61 selected from among the lower conductive patterns 61. An uppermost end of the sixth contact plug 176 and an uppermost end of the supporter 75 may be substantially coplanar with one another. Side surfaces of the supporter 75, the connection electrode layer 73G, and the horizontal wiring 71 may directly contact a side surface of the sixth contact plug 176.

Figure 15:
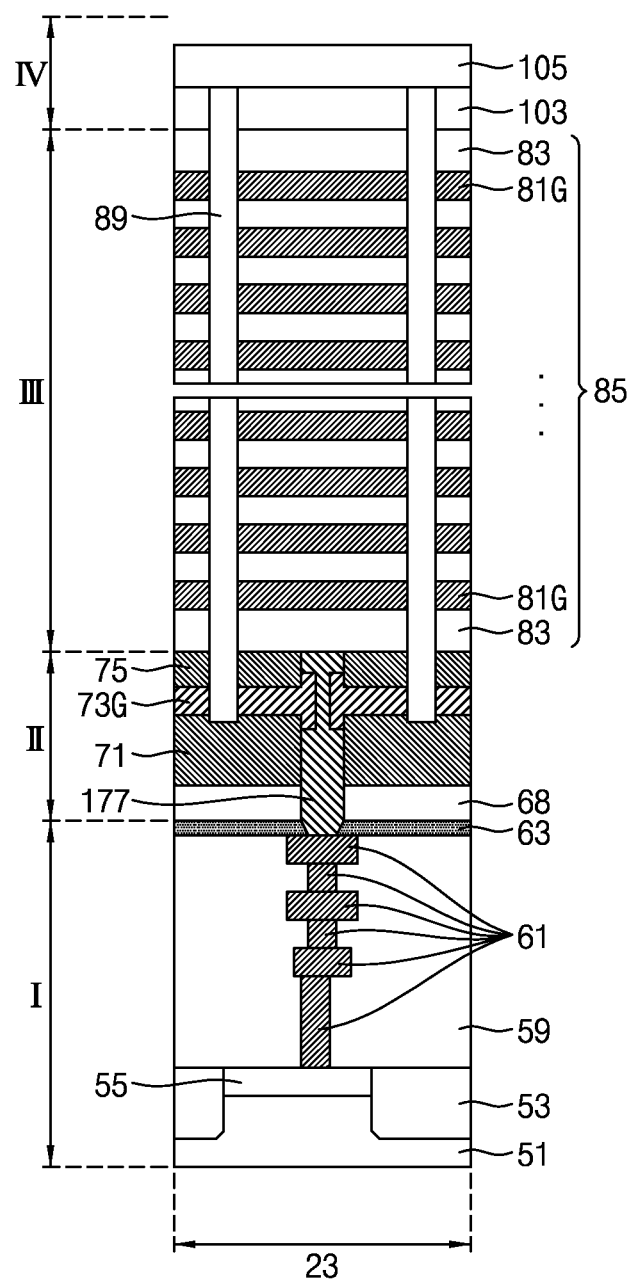

Referring to FIG. 15, semiconductor devices according to embodiments of the inventive concept may include a substrate 51, including a thirteenth region 23, and a seventh contact plug 177. The thirteenth region 23 may be adjacent to the first region (e.g., 11 of FIG. 1) or the fifth region (e.g., 15 of FIG. 1) or may be similarly configured as the first region (e.g., 11 of FIG. 1) or the fifth region (e.g., 15 of FIG. 1). The twelfth region 22 may correspond to a cell region. The connection electrode layer 73G may extend to an inner portion of the seventh contact plug 177. The connection electrode layer 73G may pass through a side surface of the seventh contact plug 177 and may enter the inner portion of the seventh contact plug 177.

Referring to FIG. 16, semiconductor devices according to embodiments of the inventive concept may include a substrate 51 including a fourth region 14, a lower circuit structure I on the substrate 51, a middle wiring structure II on the lower circuit structure I, a middle circuit structure III on the middle wiring structure II, an upper wiring structure IV on the middle circuit structure III, isolation patterns 89, a second relay plug 182, and a through via 285. In the illustrated embodiment of FIG. 16, the fourth region 14 may be adjacent to the second region (e.g., 12 of FIG. 1) or the third region (e.g., 13 of FIG. 1) or may be similarly configured as the second region (e.g., 12 of FIG. 1) or the third region (e.g., 13 of FIG. 1). The fourth region 14 may be a cross-sectional view taken along a direction intersecting with the second region (12 of FIG. 1).

The lower circuit structure I may include an isolation layer 53, impurity regions 55, a transistor 57, a first lower insulation layer 59, lower conductive patterns 61, and a second lower insulation layer 63. The middle wiring structure II may include a first middle insulation layer 68, a horizontal wiring 71, a connection electrode layer 73G, a connection mold layer 73M, a supporter 75, a first buried insulation pattern 78, and a second buried insulation pattern 79. The connection electrode layer 73G and the connection mold layer 73M may configure a connection wiring layer 73G and 73M.

The middle circuit structure III may include a stacked structure 85 and an interlayer insulation layer 86. The stacked structure 85 may include wiring layers 81G and 81M and insulation layers 83, which are repeatedly and alternately stacked. The wiring layers 81G and 81M may include electrode layers 81G and mold layers 81M. The upper wiring structure IV may include a first upper insulation layer 103, a second upper insulation layer 105, an upper plug 112, and an upper wiring 113.

The second buried insulation layer 79 may pass through the supporter 75, the connection mold layer 73M, and the horizontal wiring 71 in order to contact the first middle insulation layer 68. The second relay plug 182 may pass through the second buried insulation layer 79, the first middle insulation layer 68, and the second lower insulation layer 63 in order to directly and respectively contact the lower conductive patterns 61. Top surfaces of the second relay plug 182, the second buried insulation layer 79, and the supporter 75 may be substantially coplanar with one another.

The through via 285 may pass through the first upper insulation layer 103, the mold layers 81M and the insulation layers 83 in order to directly contact the second relay plug 182. The upper plug 112 may pass through the second upper insulation layer 105 in order to directly contact the through via 285. The upper wiring 113 may be disposed on the second upper insulation layer 105. The upper wiring 113 may directly contact the upper plug 112.

Referring to FIG. 17, semiconductor devices according to embodiments of the inventive concept may include a substrate 51, including a fourteenth region 24, and a third relay plug 183. The fourteenth region 24 may be adjacent to the second region (e.g., 12 of FIG. 1) or the fourth region (e.g., 14 of FIG. 1) or may be similarly configured as the second region (e.g., 12 of FIG. 1) or the fourth region (e.g., 14 of FIG. 1). The fourteenth region 24 may correspond to an extension region.

A portion of a supporter 75 may directly contact a top surface of a horizontal wiring 71. A first buried insulation pattern 78 may be disposed on the supporter 75. A second buried insulation pattern 79 may pass through the first buried insulation pattern 78, the supporter 75, and the horizontal wiring 71. The third relay plug 183 may pass through the second buried insulation pattern 79, a first middle insulation layer 68, and a second lower insulation layer 63 in order to directly contact one lower conductive pattern 61 selected from among the lower conductive patterns 61. An uppermost end of the third relay plug 183, a top surface of the first buried insulation pattern 78, and a top surface of the second buried insulation pattern 79 may be substantially coplanar with one another.

Referring to FIG. 18, semiconductor devices according to embodiments of the inventive concept may include a substrate 51, including a fifteenth region 25, and a fourth relay plug 184. The fifteenth region 25 may be adjacent to the second region (e.g., 12 of FIG. 1) or the fourth region (e.g., 14 of FIG. 1) or may be similarly configured as the second region (e.g., 12 of FIG. 1) or the fourth region (e.g., 14 of FIG. 1). The fifteenth region 25 may correspond to an extension region.

A connection electrode layer 73G may be disposed between a supporter 75 and a horizontal wiring 71. A second buried insulation layer 79 may pass through the supporter 75, the connection electrode layer 73G, and the horizontal wiring 71. The fourth relay plug 184 may pass through the second buried insulation pattern 79, a first middle insulation layer 68, and a second lower insulation layer 63 in order to directly contact one lower conductive pattern 61 selected from among the lower conductive patterns 61. An uppermost end of the fourth relay plug 184, a top surface of the second buried insulation pattern 79, and a top surface of the supporter 75 may be substantially coplanar with one another.

Referring to FIG. 19, semiconductor devices according to embodiments of the inventive concept may include a substrate 51, including a sixteenth region 26, and a through via 285. The sixteenth region 26 may be adjacent to the second region (e.g., 12 of FIG. 1) or the fourth region (e.g., 14 of FIG. 1) or may be similarly configured as the second region (e.g., 12 of FIG. 1) or the fourth region (e.g., 14 of FIG. 1). The sixteenth region 26 may correspond to an extension region.

The through via 285 may pass through a first upper insulation layer 103, an interlayer insulation layer 86, mold layers 81M, insulation layers 83, a second buried insulation pattern 79, a first middle insulation layer 68, and a second lower insulation layer 63 in order to directly and respectively contact the lower conductive patterns 61. Here, the second relay plug (e.g., 182 of FIG. 1) may be omitted.

Figure 20:
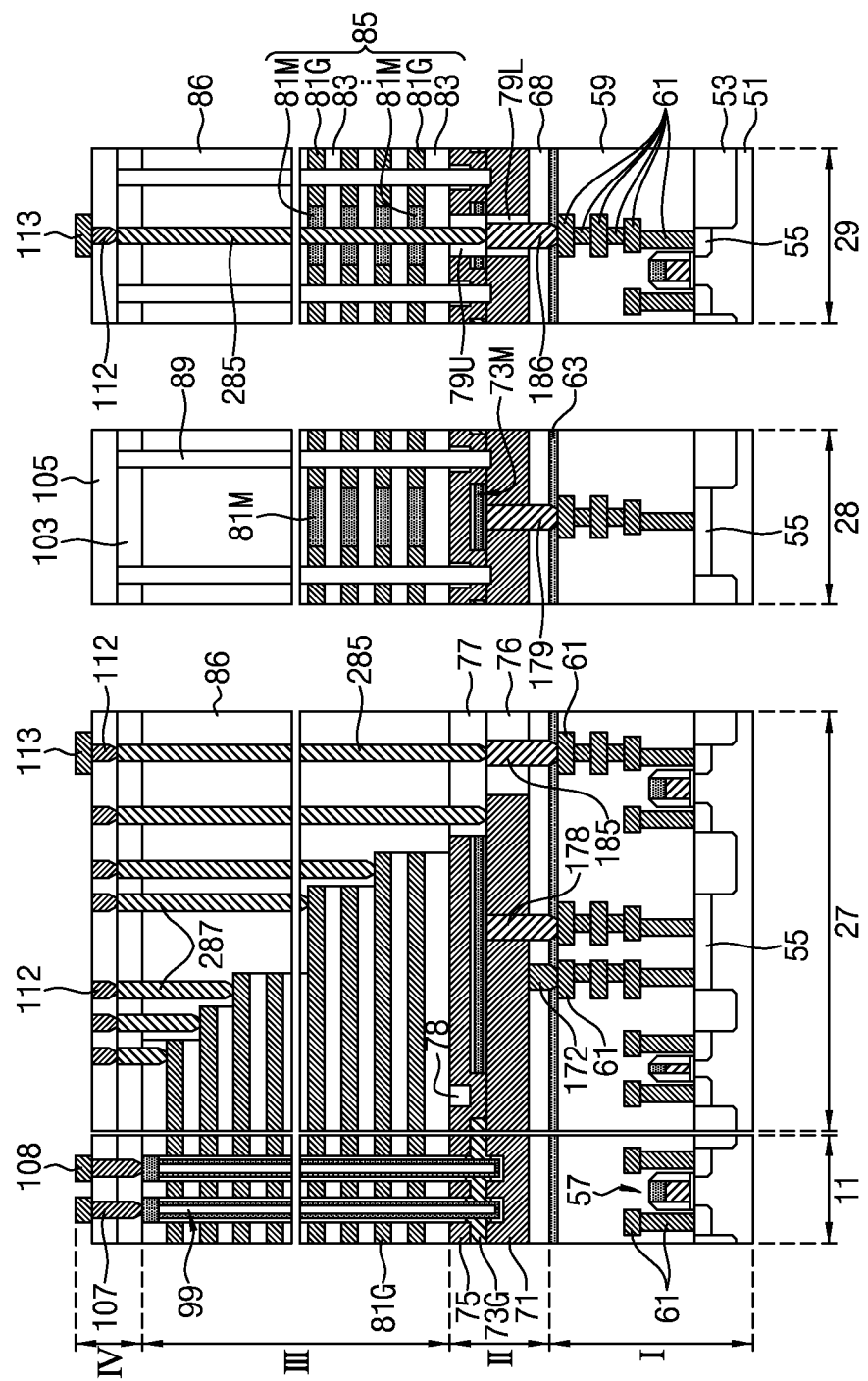
Figure 21:
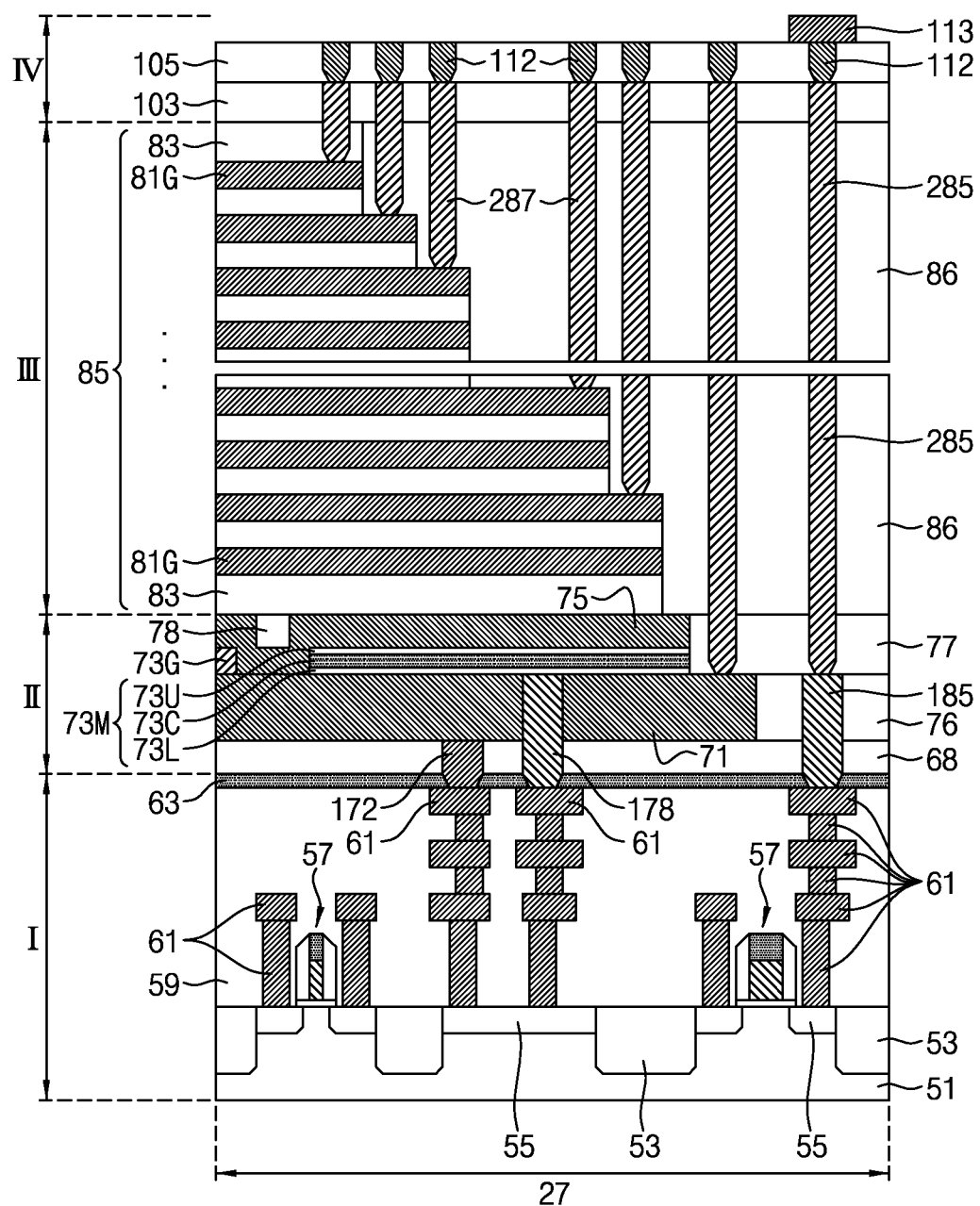
Figure 22:
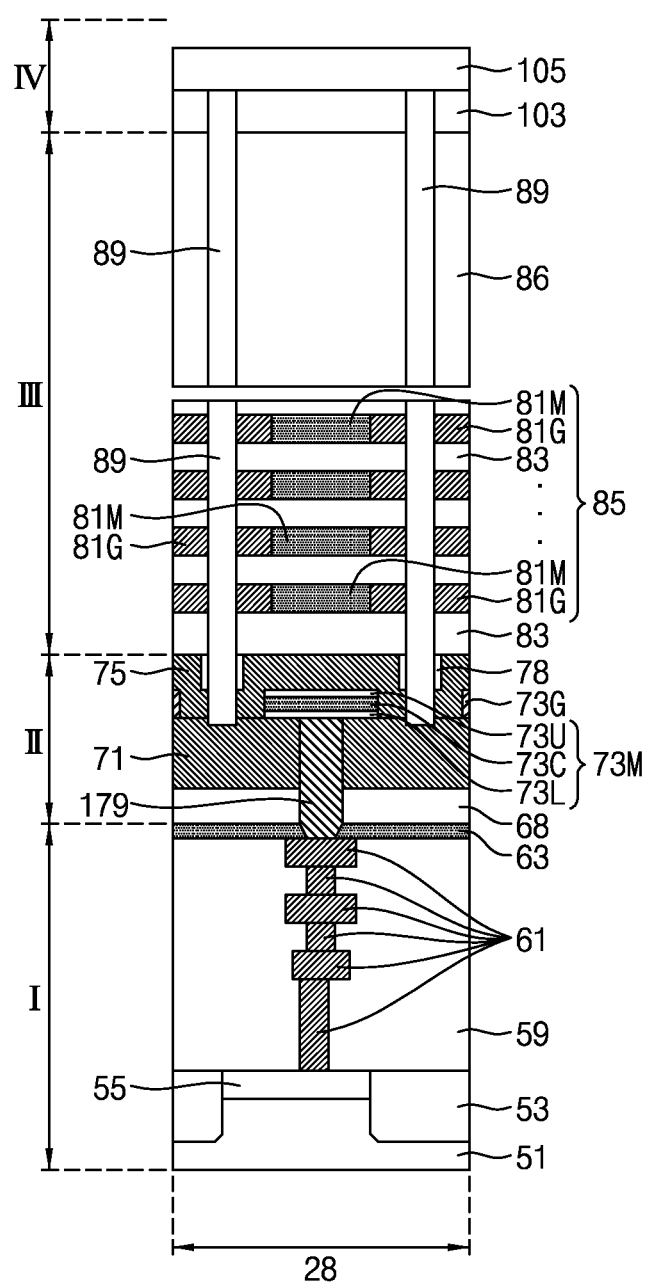
Figure 23:
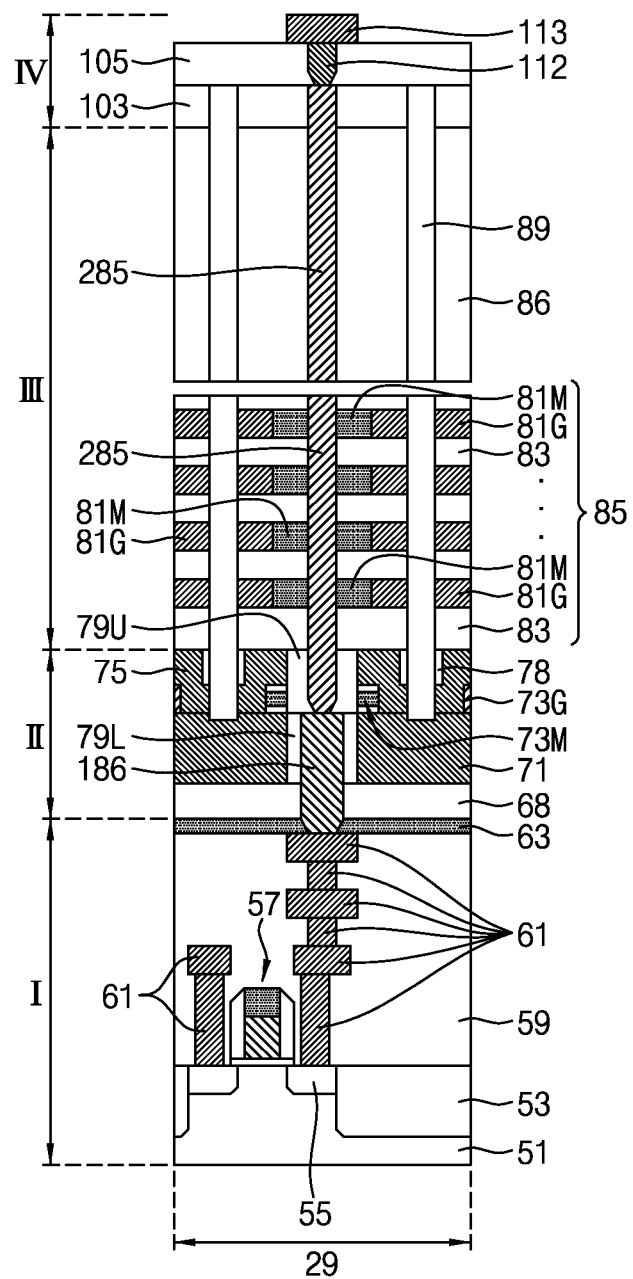

FIG. 20 is a cross-sectional diagram illustrating semiconductor devices according to embodiments of the inventive concept. FIG. 21 is an enlarged diagram further illustrating portion 27 of FIG. 20, FIG. 22 is an enlarged diagram further illustrating portion 28 of FIG. 20, and FIG. 23 is an enlarged diagram further illustrating portion 29 of FIG. 20.

Referring to FIG. 20, semiconductor devices according to embodiments of the inventive concept may include a substrate 51 including a first region 11, a seventeenth region 27, an eighteenth region 28, and a nineteenth region 29, a lower circuit structure I on the substrate 51, a middle wiring structure II on the lower circuit structure I, a middle circuit structure III on the middle wiring structure II, an upper wiring structure IV on the middle circuit structure III, isolation patterns 89, channel structures 99, contact plugs 172, 178, and 179, relay plugs 185 and 186, through vias 285, and cell contact plugs 287. In the illustrated embodiment of FIG. 20, the first region 11 may correspond to a cell region, and each of the seventeenth region 27, the eighteenth region 28, and the nineteenth region 29 may correspond to an extension region. Each of the seventeenth region 27, the eighteenth region 28, and the nineteenth region 29 may have side surface continuity with the first region 11.

The middle wiring structure II may include a first middle insulation layer 68, a horizontal wiring 71, a connection electrode layer 73G, a connection mold layer 73M, a supporter 75, a second middle insulation layer 76, a third middle insulation layer 77, a first buried insulation pattern 78, and a second buried insulation pattern 79L and 79U. The connection electrode layer 73G and the connection mold layer 73M may be configured as a connection wiring layer 73G and 73M.

The second buried insulation pattern 79L and 79U may include a lower buried insulation pattern 79L and an upper buried insulation pattern 79U. The contact plugs 172, 178, and 179 may include a second contact plug 172, an eighth contact plug 178, and a ninth contact plug 179. The contact plugs 185 and 186 may include a fifth relay plug 185 and a sixth relay plug 186. Top surfaces of the horizontal wiring 71, the eighth contact plug 178, the ninth contact plug 179, the fifth relay plug 185, and the sixth relay plug 186 may be substantially coplanar with one another.

Referring to FIG. 21, semiconductor devices according to embodiments of the inventive concept may include a substrate 51 including a seventeenth region 27, a lower circuit structure I on the substrate 51, a middle wiring structure II on the lower circuit structure I, a middle circuit structure III on the middle wiring structure II, an upper wiring structure IV on the middle circuit structure III, a second contact plug 172, an eighth contact plug 178, a fifth relay plug 185, a through via 285, and cell contact plugs 287. In the illustrated embodiment of FIG. 21, the seventeenth region 27 may have side surface continuity with the first region 11.

The middle wiring structure II may include a first middle insulation layer 68, a horizontal wiring 71, a connection electrode layer 73G, a connection mold layer 73M, a supporter 75, a second middle insulation layer 76, a third middle insulation layer 77, and a first buried insulation pattern 78. The connection electrode layer 73G and the connection mold layer 73M may be configured as a connection wiring layer 73G and 73M.

The eighth contact plug 178 may pass through the horizontal wiring 71, the first middle insulation layer 68, and the second lower insulation layer 63 in order to directly and respectively contact the lower conductive patterns 61. The fifth relay plug 185 may pass through the second middle insulation layer 76, the first middle insulation layer 68, and the second lower insulation layer 63 in order to directly contact at least one of the lower conductive patterns 61.

Top surfaces of the horizontal wiring 71, the eighth contact plug 178, and the fifth relay plug 185 may be substantially coplanar with one another. The through via 285 may pass through a first upper insulation layer 103, an interlayer insulation layer 86, and the third middle insulation layer 77 and may directly contact the fifth relay plug 185.

Referring to FIG. 22, semiconductor devices according to embodiments of the inventive concept may include a substrate 51 including an eighth region 28, a lower circuit structure I on the substrate 51, a middle wiring structure II on the lower circuit structure I, a middle circuit structure III on the middle wiring structure II, an upper wiring structure IV on the middle circuit structure III, isolation patterns 89 and a ninth contact plug 179. In the illustrated embodiment of FIG. 22, the eighth region 28 may be a cross-sectional view taken along a direction intersecting with the seventeenth region (e.g., 27 of FIG. 20).

The middle wiring structure II may include a first middle insulation layer 68, a horizontal wiring 71, a connection electrode layer 73G, a connection mold layer 73M, a supporter 75, and a first buried insulation pattern 78. The connection electrode layer 73G and the connection mold layer 73M may configure a connection wiring layer 73G and 73M. The ninth contact plug 179 may pass through the horizontal wiring 71, the first middle insulation layer 68, and the second lower insulation layer 63 and may directly contact at least a corresponding one of the lower conductive patterns 61. A bottom surface of the connection mold layer 73M may contact a top surface of the ninth contact plug 179. Top surfaces of the ninth contact plug 179 and the horizontal wiring 71 may be substantially coplanar with each other.

Referring to FIG. 23, semiconductor devices according to embodiments of the inventive concept may include a substrate 51 including a nineteenth region 29, a lower circuit structure I on the substrate 51, a middle wiring structure II on the lower circuit structure I, a middle circuit structure III on the middle wiring structure II, an upper wiring structure IV on the middle circuit structure III, isolation patterns 89, a sixth relay plug 186, and a through via 285. In an embodiment, the nineteenth region 29 may be adjacent to the seventeenth region (e.g., 27 of FIG. 20) or the eighteenth region (e.g., 28 of FIG. 20) or may be similarly configured as the seventeenth region (e.g., 27 of FIG. 20) or the eighteenth region (e.g., 28 of FIG. 20). The nineteenth region 29 may be a cross-sectional view taken along a direction intersecting with the seventeenth region (e.g., 27 of FIG. 20).

The middle wiring structure II may include a first middle insulation layer 68, a horizontal wiring 71, a connection electrode layer 73G, a connection mold layer 73M, a supporter 75, a first buried insulation pattern 78, and a second buried insulation pattern 79L and 79U. The connection electrode layer 73G and the connection mold layer 73M may configure a connection wiring layer 73G and 73M. The second buried insulation pattern 79L and 79U may include a lower buried insulation pattern 79L and an upper buried insulation pattern 79U. The upper buried insulation pattern 79U may be disposed on the lower buried insulation pattern 79L. The upper buried insulation pattern 79U may pass through the supporter 75 and the connection mold layer 73M.

The sixth relay plug 186 may pass through the lower buried insulation pattern 79L, the first middle insulation layer 68, and a second lower insulation layer 63 in order to directly contact a corresponding one of the lower conductive patterns 61. Top surfaces of the sixth relay plug 186, the lower buried insulation pattern 79L, and the horizontal wiring 71 may be substantially coplanar with one another. The through via 285 may pass through a first upper insulation 103, an interlayer insulation layer 86, mold layers 81M, insulation layers 83, and the upper buried insulation pattern 79U in order to directly contact the sixth relay plug 186.

Figure 24:
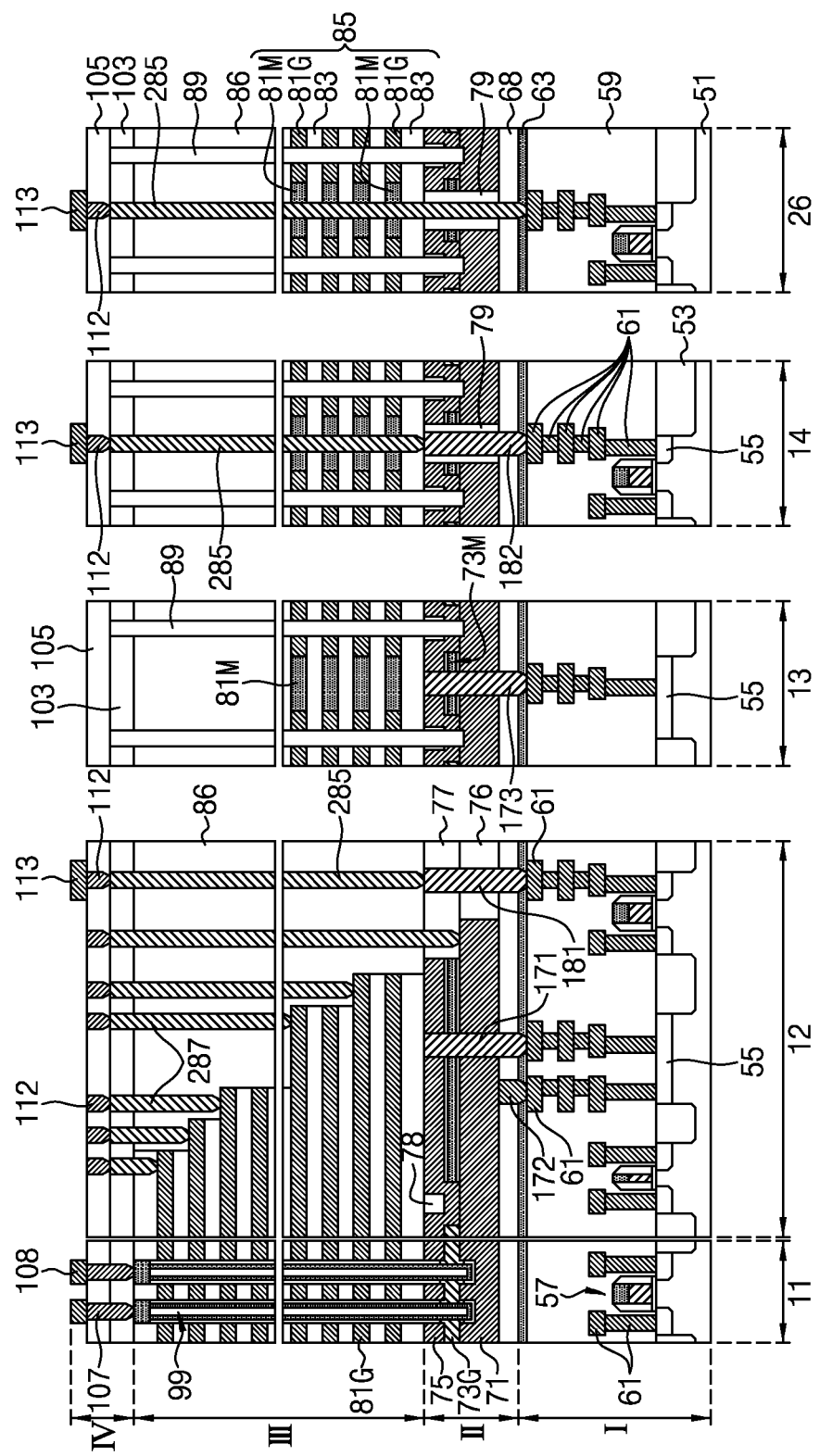
Figure 25:
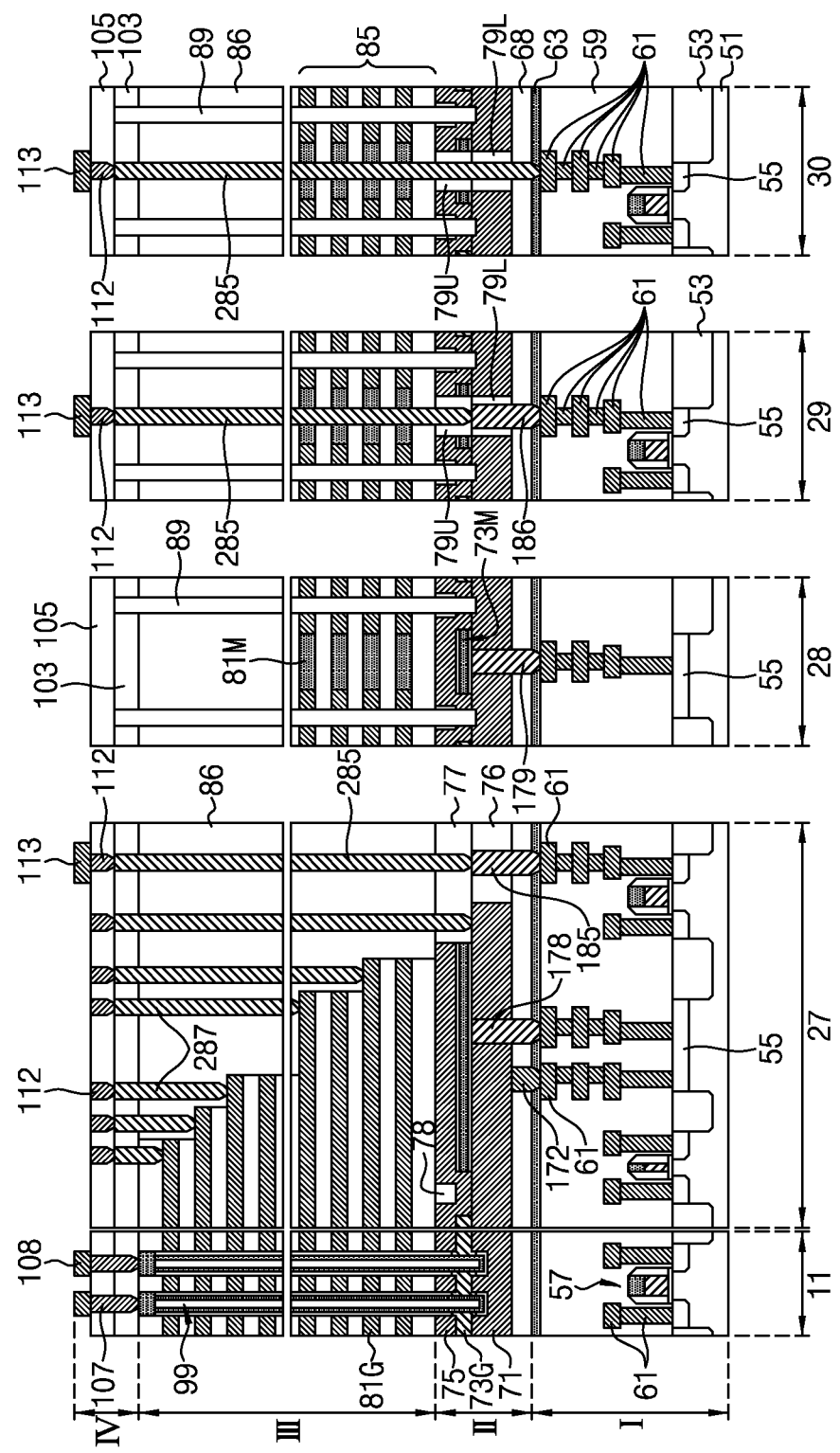

FIGS. 24 and 25 are respective, cross-sectional diagrams illustrating semiconductor devices according to embodiments of the inventive concept.

Referring to FIG. 24, semiconductor devices according to embodiments of the inventive concept may include a substrate 51 including first to fourth regions 11 to 14 and a sixteenth region 26, a lower circuit structure I on the substrate 51, a middle wiring structure II on the lower circuit structure I, a middle circuit structure III on the middle wiring structure II, an upper wiring structure IV on the middle circuit structure III, isolation patterns 89, channel structures 99, contact plugs 171 to 173, relay plugs 181 and 182, through vias 285 and cell contact plugs 287.

In the illustrated embodiment of FIG. 24, the sixteenth region 26 may be adjacent to the fourth region 14 of similarly configured as fourth region 14. The sixteenth region 26 may have a configuration similar to that previously described in relation to FIG. 19.

Referring to FIG. 25, semiconductor devices according to embodiments of the inventive concept may include a substrate 51 including a first region 11, a seventeenth region 27, an eighteenth region 28, a nineteenth region 29, and a twentieth region 30, a lower circuit structure I on the substrate 51, a middle wiring structure II on the lower circuit structure I, a middle circuit structure III on the middle wiring structure II, an upper wiring structure IV on the middle circuit structure III, isolation patterns 89, channel structures 99, contact plugs 172, 178, and 173, relay plugs 185 and 186, through vias 285 and cell contact plugs 287.

In the illustrated embodiment of FIG. 25, the first region 11 may correspond to a cell region, and each of the seventeenth region 27, the eighteenth region 28, the nineteenth region 29, and the twentieth region 30 may correspond to an extension region. Each of the seventeenth region 27, the eighteenth region 28, the nineteenth region 29, and the twentieth region 30 may have side surface continuity with the first region 11. The seventeenth region 27, the eighteenth region 28, and the nineteenth region 29 may be respectively configured as previously described in relation to FIGS. 20, 21, 22 and 23.

In the twentieth region 30, through vias 285 may pass through the first upper insulation layer 103, the interlayer insulation layer 86, the mold layers 81M, the insulation layers 83, the upper buried insulation pattern 79U, the lower buried insulation pattern 79L, the first middle insulation layer 68, and the second lower insulation layer 63 in order to directly and respectively contact the lower conductive patterns 61.

FIGS. 26, 27, 28, 29 and 30 are related, cross-sectional diagrams illustrating methods of manufacturing semiconductor devices according to embodiments of the inventive concept.

Referring to FIG. 26, a lower circuit structure I may be formed on a substrate 51 including first to fifth regions 11 to 15. The lower circuit structure I may include an isolation layer 53, impurity regions 55, transistors 57, a first lower insulation layer 59, lower conductive patterns 61 and a second lower insulation layer 63. The second lower insulation layer 63 may correspond to a capping layer or an etch stop layer.

The substrate 51 may include a semiconductor substrate such as a silicon wafer. The isolation layer 53 may include an insulation layer which is formed by using a shallow trench isolation (STI) process. The impurity regions 55 may be formed in the substrate 51 using at least one of N-type and/or P-type impurities.

The transistors 57 may be formed in and/or on the substrate 51 using various well-understood processes. The transistors 57 may include (e.g.) a fin field effect transistor (finFET), a multi-bridge channel transistor such as MBCFET®, a nano wire transistor, a vertical transistor, a recess channel transistor, a 3D transistor, a planar transistor, or a combination thereof. The transistors 57 may include some of the impurity regions 55 as respective drain or source regions.

The first lower insulation layer 59 covering the transistors 57 and the isolation layer 53 may be formed on the substrate 51. The lower conductive patterns 61 may be formed in the first lower insulation layer 59. The lower conductive patterns 61 may include a horizontal wiring and a vertical wiring, which have various shapes. Some of the lower conductive patterns 61 may directly contact the impurity regions 55. The transistors 57 and the lower conductive patterns 61 may be variously configure as one or more peripheral circuit(s). The second lower insulation layer 63 may be formed on the first lower insulation layer 59 and the lower conductive patterns 61.

Here, each of the isolation layer 53 and the first lower insulation layer 59 may include silicon oxide, silicon nitride, silicon oxynitride, low-k dielectrics, high-k dielectrics, or a combination thereof. The second lower insulation layer 63 may include a material which differs from that of the first lower insulation layer 59. The second lower insulation layer 63 may include silicon nitride, silicon oxynitride, silicon boron nitride (SiBN), silicon carbon nitride (SiCN), or a combination thereof. The lower conductive patterns 61 may include metal, metal nitride, metal oxide, metal silicide, conductive carbon, polysilicon, or a combination thereof.

Referring to FIG. 27, a first middle insulation layer 68 may be formed on the lower circuit structure I. The first middle insulation layer 68 may include silicon oxide, silicon nitride, silicon oxynitride, low-k dielectrics, high-k dielectrics, or a combination thereof. A second contact plug 172, which passes through the first middle insulation layer 68 and the second lower insulation layer 63 to contact one of the lower conductive patterns 61, may be formed. A process of forming the second contact plug 172 may include a thin film forming process and a planarization process. The planarization process may include a chemical mechanical polishing (CMP) process, an etch-back process, or a combination thereof. Top surfaces of the first middle insulation layer 68 and the second contact plug 172 may be exposed at substantially the same plane. The second contact plug 172 may include metal, metal nitride, metal oxide, metal silicide, conductive carbon, polysilicon, or a combination thereof. For example, the second contact plug 172 may include tungsten (W), tungsten nitride (WN), ruthenium (Ru), titanium (Ti), titanium nitride (TiN), tantalum (Ta), tantalum nitride (TaN), cobalt (Co), platinum (Pt), or a combination thereof.

Referring to FIG. 28, a horizontal wiring 71 and a second middle insulation layer 76 may be formed on the first middle insulation layer 68 and the second contact plug 172. A process of forming the horizontal wiring 71 and the second middle insulation layer 76 may include a number of thin film forming processes, a patterning process, and a planarization process. Top surfaces of the horizontal wiring 71 and the second middle insulation layer 76 may be exposed at substantially the same plane. A bottom surface of the horizontal wiring 71 may directly contact a top surface of the second contact plug 172. The horizontal wiring 71 may include a single layer or a multilayer. The horizontal wiring 71 may include metal, metal nitride, metal silicide, metal oxide, conductive carbon, polysilicon, or a combination thereof. For example, the horizontal wiring 71 may include a doped polysilicon layer.

A connection mold layer 73M, a supporter 75, and a third middle insulation layer 77 may be formed on the horizontal wiring 71 and second middle insulation layer 76. The connection mold layer 73M may include a material having an etch selectivity with respect to the horizontal wiring 71 and the supporter 75. The connection mold layer 73M may include various configurations as described above with reference to FIG. 6. For example, the connection mold layer 73M may include a lower mold layer 73L, an upper mold layer 73U on the lower mold layer 73L, and a middle mold layer 73C between the lower mold layer 73L and the upper mold layer 73U.

The supporter 75 may cover the connection mold layer 73M. Some portions of the supporter 75 may pass through the connection mold layer 73M to directly contact a top surface of the horizontal wiring 71. The supporter 75 may directly contact a top surface and a side surface of the connection mold layer 73M. The third middle insulation layer 77 may contact a side surface of the supporter 75 and a side surface of the connection mold layer 73M. A first buried insulation pattern 78 may be formed on the supporter 75. A second buried insulation pattern 79 passing through the supporter 75, the connection mold layer 73M, and the horizontal wiring 71 may be formed. The third middle insulation layer 77 and the first buried insulation pattern 78 may include the same material which is formed simultaneously. In certain embodiments, the third middle insulation layer 77 may be omitted.

A process of forming the connection mold layer 73M, the supporter 75, the third middle insulation layer 77, the first buried insulation pattern 78, and the second buried insulation pattern 79 may include a number of thin film forming processes, patterning processes and/or planarization processes. The planarization process may include a CMP process, an etch-back process, or a combination thereof. Top surfaces of the supporter 75, the third middle insulation layer 77, the first buried insulation pattern 78, and the second buried insulation pattern 79 may be exposed at substantially the same plane. Each of the second middle insulation layer 76, the third middle insulation layer 77, the first buried insulation pattern 78, and the second buried insulation pattern 79 may include silicon oxide, silicon nitride, silicon oxynitride, low-k dielectrics, high-k dielectrics, or a combination thereof. In an embodiment, the supporter 75 may include a polysilicon layer.

Referring to FIG. 29, a first contact plug 171, a third contact plug 173, a first relay plug 181, and a second relay plug 182 may be formed. The first contact plug 171, the second contact plug 172, and the third contact plug 173 may be variously configured as contact plugs 171 to 173. The first relay plug 181 and the second relay plug 182 may be variously configured as relay plugs 181 and 182. A process of forming the first contact plug 171, the third contact plug 173, the first relay plug 181, and the second relay plug 182 may include a patterning process, a thin film forming process, and a planarization process. The planarization process may include a CMP process, an etch-back process, or a combination thereof. Top surfaces of the supporter 75, the third middle insulation layer 77, the first buried insulation pattern 78, the second buried insulation pattern 79, the first contact plug 171, the third contact plug 173, the first relay plug 181, and the second relay plug 182 may be exposed at substantially the same plane.

Each of the first contact plug 171, the third contact plug 173, the first relay plug 181, and the second relay plug 182 may include metal, metal nitride, metal silicide, metal oxide, conductive carbon, polysilicon, or a combination thereof. For example, each of the first contact plug 171, the third contact plug 173, the first relay plug 181, and the second relay plug 182 may include W, WN, Ru, Ti, TiN, Ta, TaN, Co, Pt, or a combination thereof. The first relay plug 181 and the second relay plug 182 may include materials which are the same as those of the first contact plug 171 and the third contact plug 173 and are formed simultaneously.

Each of the first contact plug 171 and the third contact plug 173 may pass through the supporter 75, the connection mold layer 73M, the horizontal wiring 71, the first middle insulation layer 68, and the second lower insulation layer 63 to contact a corresponding one of the lower conductive patterns 61. Each of the first contact plug 171 and the third contact plug 173 may directly contact the supporter 75, the connection mold layer 73M, and the horizontal wiring 71. The first relay plug 181 may pass through the third middle insulation layer 77, the second middle insulation layer 76, the first middle insulation layer 68, and the second lower insulation layer 63 to contact a corresponding one of the lower conductive patterns 61. The second relay plug 182 may pass through the second buried insulation pattern 79, the first middle insulation layer 68, and the second lower insulation layer 63 to contact a corresponding one of the conductive patterns 61.

Figure 30:
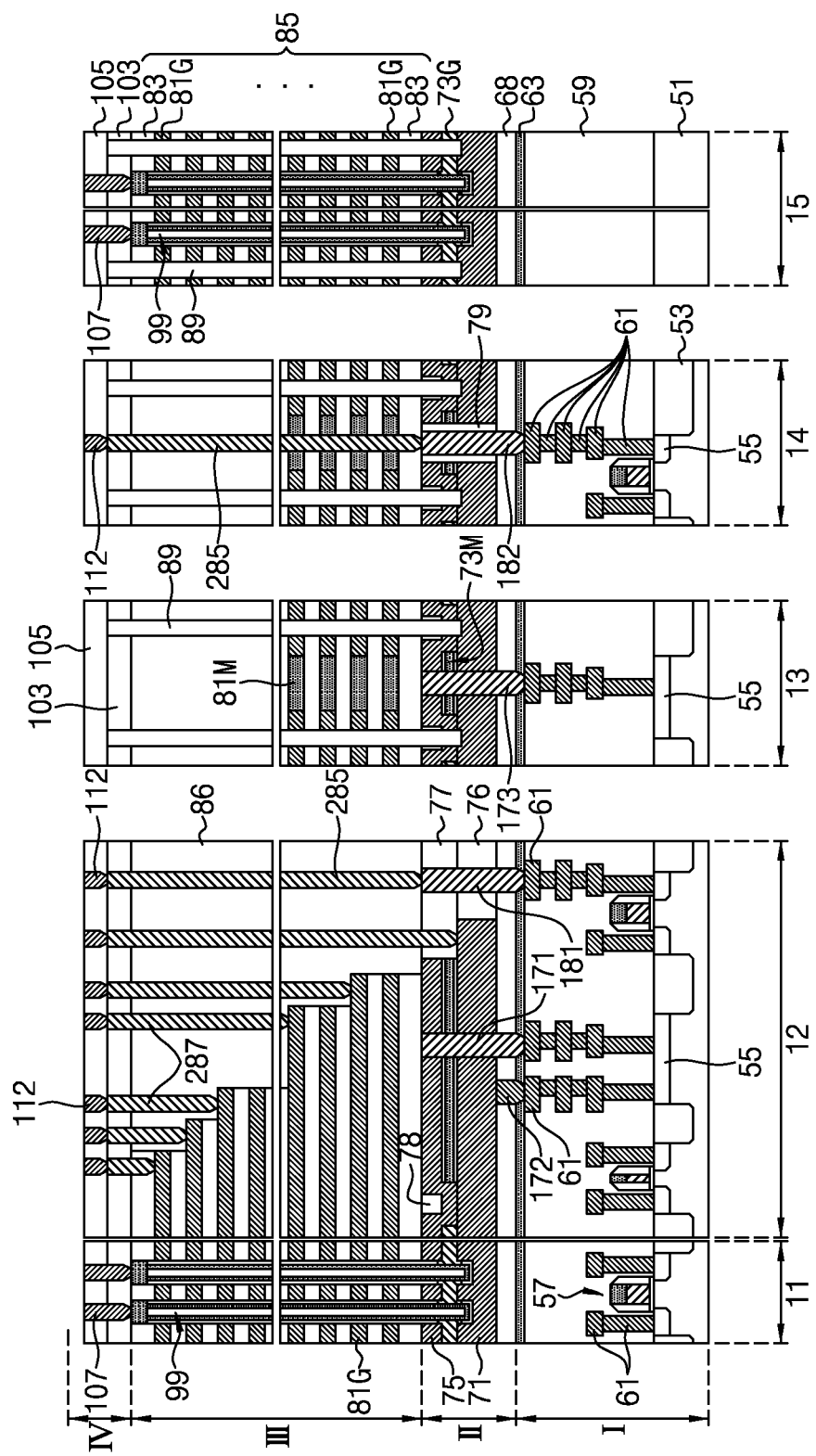

Referring to FIG. 30, a middle wiring structure II on the lower circuit structure I, a middle circuit structure III on the middle wiring structure II, a first upper insulation layer 103 on the middle circuit structure III, a second upper insulation layer 105, bit plugs 107, upper plugs 112, isolation patterns 89, channel structures 99, through vias 285 and cell contact plugs 287 may be formed. The connection mold layer 73M may be partially substituted, thereby forming a connection electrode layer 73G.

The middle wiring structure II may include the first middle insulation layer 68, the horizontal wiring 71, the connection electrode layer 73G, the connection mold layer 73M, the supporter 75, the second middle insulation layer 76, the third middle insulation layer 77, the first buried insulation pattern 78, and the second buried insulation pattern 79. The middle circuit structure III may include a stacked structure 85 and an interlayer insulation layer 86. The stacked structure 85 may include wiring layers 81G and 81M and insulation layers 83, which are repeatedly and alternately stacked. The wiring layers 81G and 81M may include electrode layers 81G and mold layers 81M.

A process of forming the through vias 285 and the cell contact plugs 287 may include a patterning process and a thin film forming process. The through vias 285 and the cell contact plugs 287 may include the same materials, and may therefore be simultaneously formed. According to certain embodiments of the inventive concept, the first relay plug 181 and the second relay plug 182 may include the same materials as those of the first contact plug 171 and the third contact plug 173, and may therefore be simultaneously formed. Hence, the level of complexity and difficulty of the processes required to form the through vias 285 may be considerably reduced in relation to the first relay plug 181 and the second relay plug 182.

Referring back to FIG. 1, bit lines 108 and upper wirings 113 may be formed on the second upper insulation layer 105. The first upper insulation layer 103, the second upper insulation layer 105, the bit plugs 107, the bit lines 108, the upper plugs 112 and the upper wirings 113 may variously configured to form an upper wiring structure IV.

Each of the connection electrode layer 73G, the electrode layers 81G, the bit plugs 107, the bit lines 108, the upper plugs 112, the upper wirings 113, the through vias 285 and the cell contact plugs 287 may include metal, metal nitride, metal silicide, metal oxide, conductive carbon, polysilicon, or a combination thereof. Each of the insulation layers 83, the mold layers 81M, the interlayer insulation layer 86, the isolation patterns 89, the first upper insulation layer 103, and the second upper insulation layer 105 may include silicon oxide, silicon nitride, silicon oxynitride, low-k dielectrics, high-k dielectrics, or a combination thereof. In certain embodiments, the mold layers 81M may include silicon nitride.

According to the embodiments of the inventive concept, various contact plugs, relay plugs, through vias and cell contact plugs may be provided. However, the level of complexity and difficulty associated with the processes required to form the through vias may be considerably reduced. Accordingly, semiconductor devices according to embodiments of the inventive concept exhibit excellent electrical performance, yet may be manufactured using a simplified sequence of processes.

Embodiments of the inventive concept have been described with reference to the accompanying drawings, but those skilled in the art will recognize that many changes and modifications are possible with respect to the illustrated embodiments without removing same from the scope of the inventive concept as defined by the following claims.

What is claimed is:

1. A semiconductor device comprising:
 a lower circuit structure including a substrate and a first lower conductive pattern on the substrate;
 a middle wiring structure disposed on the lower circuit structure, the middle wiring structure including a horizontal wiring;
 a middle circuit structure disposed on the middle wiring structure, the middle circuit structure including a stacked structure including alternately stacked wiring layers and insulation layers;
 a channel structure extending through an inner portion of the stacked structure to contact the horizontal wiring; and
 a contact plug extending through an inner portion of the middle wiring structure to connect the first lower conductive pattern and the horizontal wiring,
 wherein a lowermost end of the channel structure is farther away from a top surface of the substrate than a bottom surface of the horizontal wiring,
 an uppermost end of the contact plug is farther away from the top surface of the substrate than the bottom surface of the horizontal wiring, and the uppermost end of the contact plug is disposed closer to the top surface of the substrate than a lowermost end of each of the wiring layers.

2. The semiconductor device of claim 1, wherein the contact plug passes through the horizontal wiring, and top surfaces of the contact plug and the horizontal wiring are substantially coplanar.

3. The semiconductor device of claim 1, wherein the middle wiring structure further comprises:
   a supporter on the horizontal wiring; and
   a connection wiring layer between the horizontal wiring and the supporter,
   wherein the uppermost end of the contact plug is substantially coplanar with an uppermost end of the supporter.

4. The semiconductor device of claim 3, wherein the connection wiring layer includes a connection electrode layer and a connection mold layer disposed at substantially a same level as the connection electrode layer, and
   the contact plug passes through the supporter, the horizontal wiring and at least one of the connection mold layer and the connection electrode layer.

5. The semiconductor device of claim 4, wherein the connection mold layer includes a lower mold layer, an upper mold layer on the lower mold layer, and a middle mold layer between the lower mold layer and the upper mold layer,
   the lower mold layer and the upper mold layer include silicon oxide,
   the middle mold layer includes silicon nitride, and
   the contact plug contacts side surfaces of the lower mold layer, the middle mold layer and the upper mold layer.

6. The semiconductor device of claim 4, wherein a portion of the supporter directly contacts the horizontal wiring,
   the middle wiring structure further includes a first buried insulation pattern disposed on the portion of the supporter, and
   the contact plug passes through the first buried insulation pattern, the supporter and the horizontal wiring.

7. The semiconductor device of claim 1, further comprising:
   a through via extending through an inner portion of the middle circuit structure, wherein the lower circuit structure further comprises a second lower conductive pattern connected to the through via.

8. The semiconductor device of claim 7, further comprising:
   cell contact plugs extending through an inner portion of the middle circuit structure,
   wherein the wiring layers include electrode layers and mold layers, each of the mold layers is disposed at substantially a same level as a corresponding one of the electrode layers, and each of the cell contact plugs contacts a corresponding one of the electrode layers.

9. The semiconductor device of claim 8, wherein uppermost ends of the through via and the cell contact plugs are substantially coplanar.

10. The semiconductor device of claim 7, further comprising:
    a conductive plug disposed between the second lower conductive pattern and the through via and extending through an inner portion of the middle wiring structure.

11. The semiconductor device of claim 10, wherein an uppermost end of the conductive plug is substantially coplanar with the uppermost end of the contact plug.

12. The semiconductor device of claim 10, wherein the conductive plug includes a same material as the contact plug.

13. The semiconductor device of claim 10, wherein the middle wiring structure further includes a second buried insulation pattern passing through the horizontal wiring, and
    the conductive plug passes through the second buried insulation pattern.

14. The semiconductor device of claim 10, wherein top surfaces of the conductive plug and the horizontal wiring are substantially coplanar.

15. The semiconductor device of claim 10, wherein the middle wiring structure includes a supporter on the horizontal wiring, a connection wiring layer between the horizontal wiring and the supporter, and a second buried insulation pattern passing through the supporter, the connection wiring layer and the horizontal wiring, and
    the conductive plug passes through the second buried insulation pattern.

16. The semiconductor device of claim 15, wherein top surfaces of the conductive plug, the second buried insulation pattern, and the supporter are substantially coplanar.

17. A semiconductor device comprising:
    a lower circuit structure including a substrate and a lower conductive pattern on the substrate;
    a middle wiring structure disposed on the lower circuit structure, the middle wiring structure including a horizontal wiring;
    a middle circuit structure disposed on the middle wiring structure, the middle circuit structure including a stacked structure including alternately stacked wiring layers and insulation layers;
    channel structures respectively extending through an inner portion of the stacked structure to contact the horizontal wiring;
    a conductive plug extending through an inner portion of the middle wiring structure to contact the lower conductive pattern;
    a through via disposed on the conductive plug and extending through an inner portion of the middle circuit structure; and
    cell contact plugs extending through the inner portion of the middle circuit structure to contact respective ones of the wiring layers,
    wherein a lowermost end of each one of the channel structures is farther away from a top surface of the substrate than a bottom surface of the horizontal wiring,
    an uppermost end of the conductive plug is farther away from the top surface of the substrate than the bottom surface of the horizontal wiring, and
    the uppermost end of the conductive plug is disposed closer to the top surface of the substrate than a lowermost end of each one of the wiring layers.

18. The semiconductor device of claim 17, wherein the middle wiring structure includes a connection mold layer on the horizontal wiring, a supporter on the connection mold layer, and a buried insulation pattern passing through the supporter and the connection mold layer,
    the conductive plug passes through the buried insulation pattern, and
    top surfaces of the conductive plug, the buried insulation pattern, and the supporter are substantially coplanar.

19. The semiconductor device of claim 17, wherein the uppermost end of the conductive plug is substantially coplanar with an uppermost end of the horizontal wiring.

20. A semiconductor device comprising:
    a lower circuit structure including a substrate, and a first lower conductive pattern and a second lower conductive pattern on the substrate;

a middle wiring structure disposed on the lower circuit structure, the middle wiring structure including a horizontal wiring;

a middle circuit structure disposed on the middle wiring structure, the middle circuit structure including a stacked structure including alternately stacked wiring layers and insulation layers;

channel structures respectively extending through an inner portion of the stacked structure to contact the horizontal wiring;

a contact plug extending through an inner portion of the middle wiring structure to connect the first lower conductive pattern and the horizontal wiring;

a conductive plug extending through the inner portion of the middle wiring structure to contact the second lower conductive pattern;

a through via disposed on the conductive plug and extending through an inner portion of the middle circuit structure;

cell contact plugs extending through the inner portion of the middle circuit structure to contact respective ones of the wiring layers; and an upper wiring structure disposed on the middle circuit structure, the upper wiring structure including bit lines connected to the channel structures, and an upper wiring connected to the through via, wherein uppermost ends of the contact plug and the conductive plug are substantially coplanar, the uppermost ends of the contact plug and the conductive plug are farther away from a top surface of the substrate than a bottom surface of the horizontal wiring, and the uppermost ends of the contact plug and the conductive plug are disposed closer to the top surface of the substrate than a lowermost end of each of the wiring layers.

* * * * *